(12) United States Patent
Zuppero et al.

(10) Patent No.: US 8,829,325 B2
(45) Date of Patent: Sep. 9, 2014

(54) SYSTEM AND METHOD FOR USING PRE-EQUILIBRIUM BALLISTIC CHARGE CARRIER REFRACTION

(75) Inventors: Anthony C. Zuppero, Pollock Pines, CA (US); Jawahar M. Gidwani, San Francisco, CA (US)

(73) Assignee: Neokismet L.L.C., San Francisco, CA (US)

(*) Notice: Subject to any disclaimer, the term of this patent is extended or adjusted under 35 U.S.C. 154(b) by 135 days.

(21) Appl. No.: 13/397,618

(22) Filed: Feb. 15, 2012

(65) Prior Publication Data

US 2012/0160289 A1  Jun. 28, 2012

Related U.S. Application Data

(60) Continuation of application No. 12/650,841, filed on Dec. 31, 2009, now Pat. No. 8,378,207, which is a division of application No. 11/762,864, filed on Jun. 14, 2007, now Pat. No. 7,663,053.

(60) Provisional application No. 60/883,748, filed on Jan. 5, 2007.

(51) Int. Cl.
*H01L 35/30* (2006.01)
*H02N 11/00* (2006.01)
*H01L 29/66* (2006.01)

(52) U.S. Cl.
CPC ........................................ *H01L 29/66* (2013.01)
USPC ............................. 136/205; 310/300; 310/306

(58) Field of Classification Search
USPC .................... 136/205; 310/300, 306
See application file for complete search history.

(56) References Cited

U.S. PATENT DOCUMENTS

| | | | |
|---|---|---|---|
| 5,955,772 A | 9/1999 | Shakouri et al. | |
| 6,262,357 B1 * | 7/2001 | Johnson et al. | 136/203 |
| 6,323,414 B1 | 11/2001 | Shakouri et al. | |
| 6,396,191 B1 | 5/2002 | Hagelstein et al. | |
| 6,403,874 B1 | 6/2002 | Shakouri et al. | |
| 6,649,823 B2 | 11/2003 | Zuppero et al. | |
| 6,903,433 B1 | 6/2005 | McFarland et al. | |
| 6,916,451 B1 * | 7/2005 | Zuppero et al. | 422/186.03 |
| 7,109,408 B2 | 9/2006 | Kucherov et al. | |
| 7,119,272 B2 | 10/2006 | Zuppero et al. | |

(Continued)

OTHER PUBLICATIONS

Xiao Z. Ji and and Gabor A. Somorjai, "Continuous Hot Electron Generation in Pt/TiO2, Pd/TiO2, and Pt/GaN Catalytic Nanodiodes from Oxidation of Carbon Monoxide", The Journal of Physical Chemistry B 2005 109 (47), 22530-22535.*

(Continued)

*Primary Examiner* — Jonathan Johnson
*Assistant Examiner* — Allison Bourke
(74) *Attorney, Agent, or Firm* — Dickstein Shapiro LLP

(57) ABSTRACT

A method and system for using a method of pre-equilibrium ballistic charge carrier refraction comprises fabricating one or more solid-state electric generators. The solid-state electric generators include one or more of a chemically energized solid-state electric generator and a thermionic solid-state electric generator. A first material having a first charge carrier effective mass is used in a solid-state junction. A second material having a second charge carrier effective mass greater than the first charge carrier effective mass is used in the solid-state junction. A charge carrier effective mass ratio between the second effective mass and the first effective mass is greater than or equal to two.

24 Claims, 14 Drawing Sheets

(56) References Cited

U.S. PATENT DOCUMENTS

| | | |
|---|---|---|
| 7,122,735 B2 | 10/2006 | Zuppero et al. |
| 7,208,767 B2 | 4/2007 | Zuppero et al. |
| 7,223,914 B2 | 5/2007 | Zuppero et al. |
| 2002/0121088 A1 | 9/2002 | Zuppero et al. |
| 2004/0182431 A1 | 9/2004 | Zuppero et al. |
| 2007/0163874 A1 | 7/2007 | Zuppero et al. |

OTHER PUBLICATIONS

Jeong Young Park, J.R. Renzas, Bryan B. Hsu, Gabor A. Somorjai "Interfacial and Chemical Properties of Pt/Tio2, Pd/TiO2, and Pt/GaN Catalytic Nanodiodes Influencing Hot Electron Flow" J. Phys. Chem C, vol. 111, No. 42 pp. 15331-15336, Jul. 25, 2007.

Extended European Search Report for EP Application No. 07869983.2, dated Feb. 3, 2012.

Dittrich, Th. etal., Electrical transport in passivated Pt/TiO2/Ti Schottky diodes, Journal of Applied Physics 98, 104501 (2005).

R.D. Fedorovich et al. Electron and Light Emission From Island Metal Films and Generation of Hot Electrons in Nanoparticles, Physics Reports 328 (2000), pp. 73-179.

Y. Huang, et al., Vibrational Promotion of Electron Transfer, Science, vol. 290, Oct. 6, 2000.

Xiao Z. Ji, et al., Continuous Hot Electron Generation in Pt/TiO2, and Pt/GaN Catalytic Nanodiodes From Oxidation of Carbon Monoxide, J. Phys. Chem. B 2005, 109, pp. 22530-22535.

Xiao Zhong Ji, et al., The Catalytic Nanodiode: Gas Phase Catalytic Nanodiode: Gas Phase Catalytic Reaction Generated Electron Flow Using Nanoscale Platinum Titanium Oxide Schottky Diodes, Nano Letters 2005, vol. 5, No. 4, pp. 753-756.

Zhi, Liu, et al., Narrow cone emission from negative electron affinity photocathodes, J. Vac. Sci Technol B23(6), Nov./Dec. 2005, p. 2758.

B. Moyzhes, et al., Thermoelectric figure of merit of metal-semiconductor barrier structure based on energy relaxation length, Applied Physics Letters, vol. 73, No. 13, Sep. 28, 1998.

M.F. O'Dwyer, et al., Electronic efficiency in nanostructured thermionic and thermoelectric devices, Physical Review B 72, 205330 (2005).

M.F. O'Dwyer, et al., Low thermal conductivity short-period superlattice thermionic devices, Journal of Physics D: Applied Physics 39 (2006) pp. 4153-4158.

C.A. Papadopoulos, et al., A new planar device based on Seebeck effect for gas sensing applications, Sensors and Actuators B 34 (1996) 524-527.

Fabin Qiu, et al., Miniaturization of thermoelectric hydrogen sensor prepared on glass substrate with low-temperature crystallized SiGe film, Sensors and Actuators B 103 (2004) pp. 252-259.

Daryoosh Vashaee, et al., Thermionic power generation at high temperatures using SiGe/Si superlattices, Journal of Applied Physics 101, 053719 (2007).

Kai Zhu, et al., Enhanced Charge-Collection Efficiencies and Light Scattering in Dye-Sensitized Solar Cells Using Oriented TiO2 Nanotubes Arrays, Nano Letters 2007, vol. 7, No. 1, pp. 69-74.

Jeong Young Park et al., "Energy Conversion From Catalytic Reaction to Hot Electron Current With Metal-Semiconductor Schottky Nanodiodes" J. Vac. Sci. Technol. vol. 24, No. 4, Jul./Aug. 2006.

Jeong Young Park et al., "The Catalytic Nanodiode: Detecting Continous Electron Flow at Oxide-Metal Interfaces Generated by a Gas-Phase Exothermic Reaction", Chem PhysChem 2006, 7, 1409-1413.

Xiaozhong Ji, et al. Electron Flow Generated by Gas Phase Exothermic Catalytic Reactions Using a Platinum-Gallium Nitride Nanodiode; Dept. of Chemistry, J.AM.Chem.Soc. 2005, 127, 5792-5793.

Thermal Analysis of Ultra-Thin Body Device Sealing; E.Pop, R. Dutton and K.Goodson, Dept of Electrical and Mechanical Engineering, Stanford University, IEEE 2003, pp. 66.6.1-366.4.

Simulation of self-heating effects in different SOI MOS architectures; M.Braccioli, G. Curatola, Y. Yang, E. Sangiorgi, C. Giegna; Solid-State Electronics 53, 2009 pp. 445-451.

Impact of self-heating and Thermal Coupling on Analog Circuits in SOI CMOS, B. Tenbroek, M. S.L. Lee, W. Redman-White, J. Bunyan, M. Uren, IEEE Journal of Solid-State Circuits, vol. 33, No. 7, Jul. 1998, pp. 1037, 1046.

Investigation of Self-Heating Effects in Individual SOQ Devices and Device-Device Interactions; M. Arifuzzaman, D. Vasileska, Arizona State Univer, Tempe, AZ p. 269.

Heat Generation and Transport in Nanometer-Scale Transistors; E. Pop, S. Sinha, K. Goodson, IEEE, vol. 94 No. 8, Aug. 2006, pp. 1587-1601.

\* cited by examiner

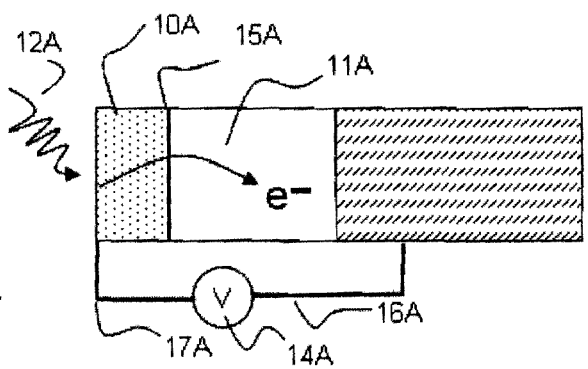
Figure 1-A
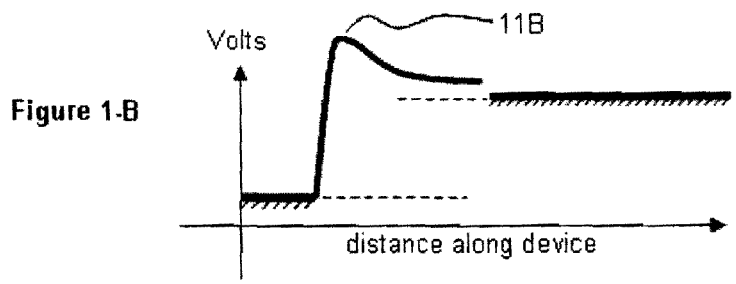
Figure 1-B
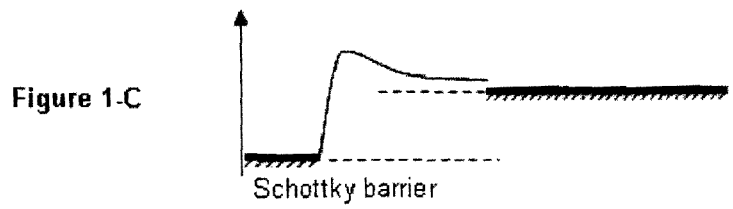
Figure 1-C
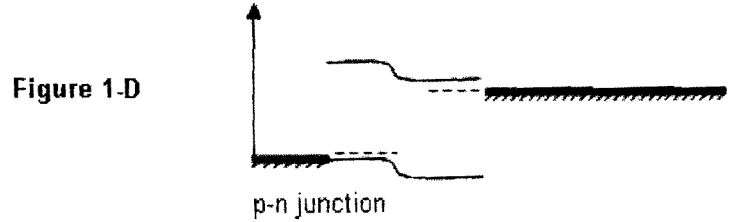
Figure 1-D
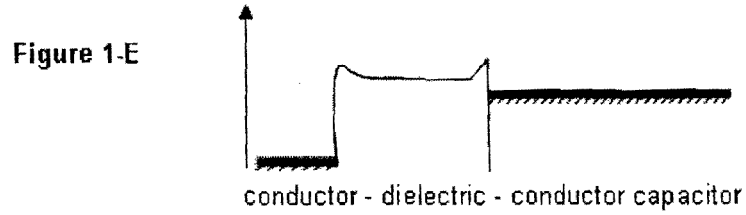
Figure 1-E

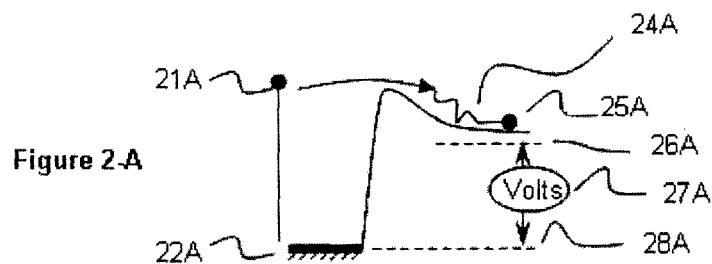
Figure 2-A
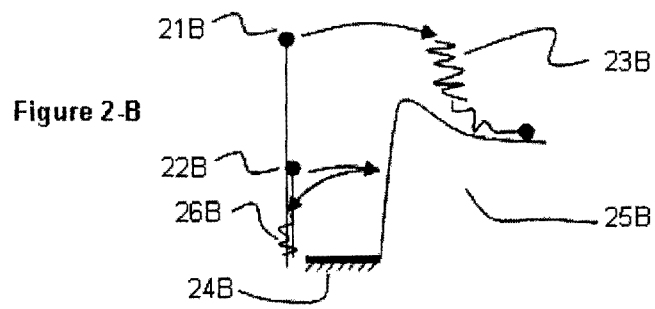
Figure 2-B
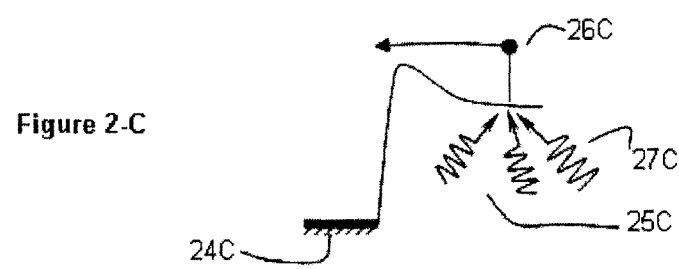
Figure 2-C
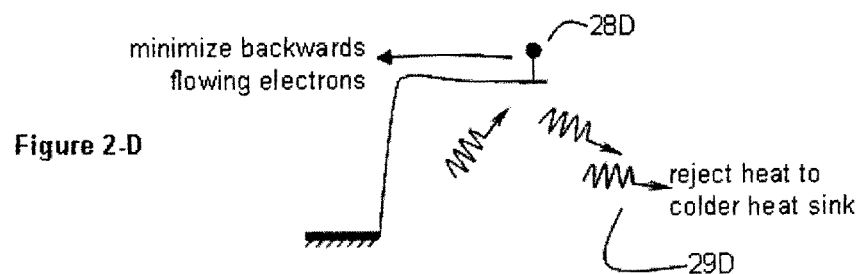
Figure 2-D Figure 3-A
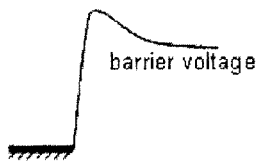
barrier voltage
low hi
electron effective mass electron effective mass
Figure 3-B
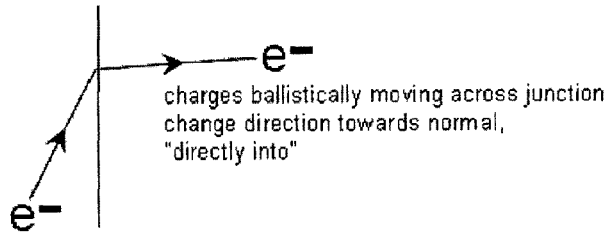
charges ballistically moving across junction change direction towards normal, "directly into"
Figure 3-C
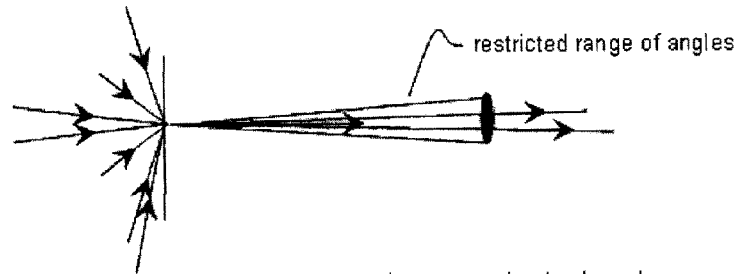
restricted range of angles
Figure 3-D
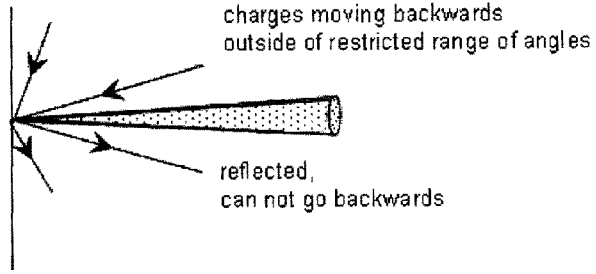
charges moving backwards outside of restricted range of angles
reflected, can not go backwards

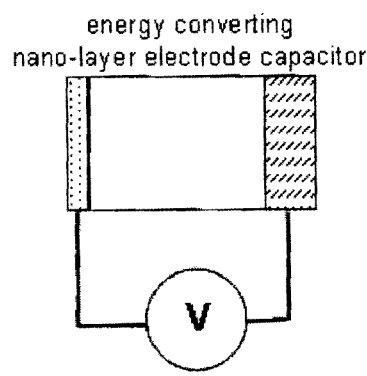
Figure 4-A
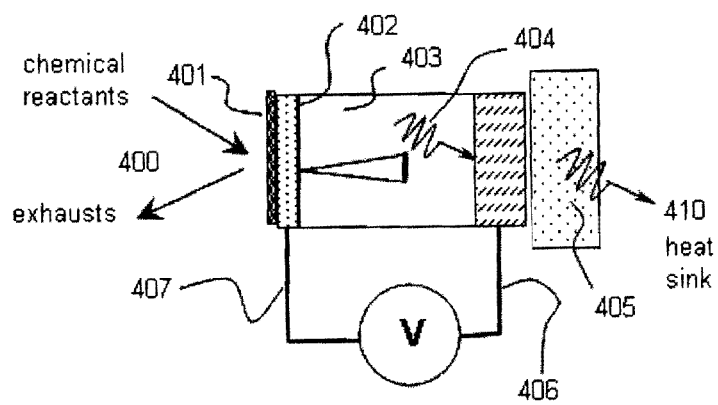
**Figure 4-B

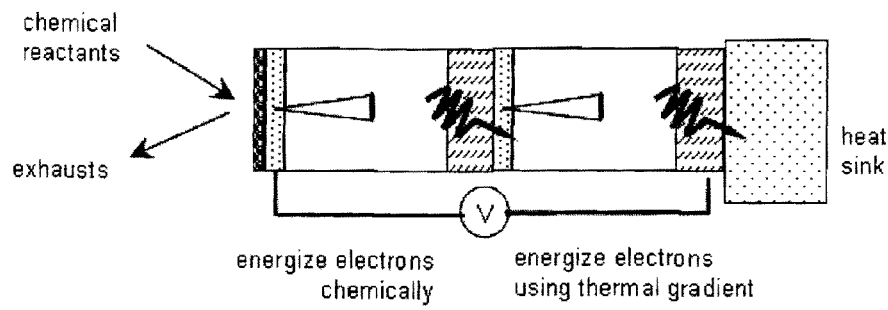
Figure 5-A
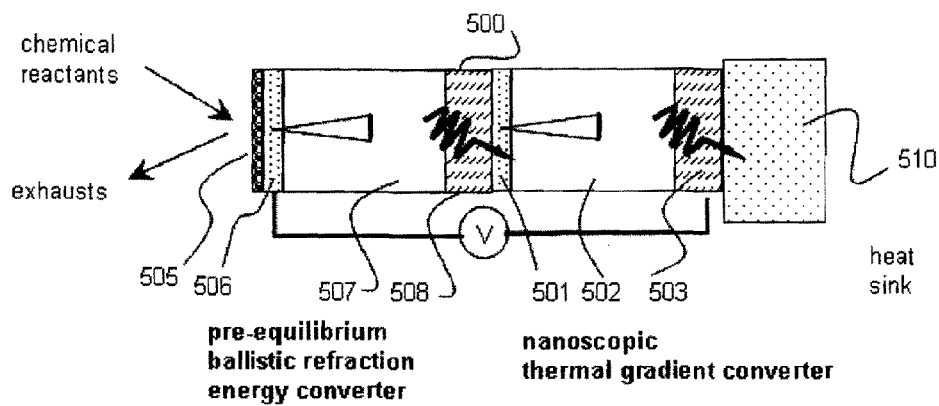
Figure 5-B
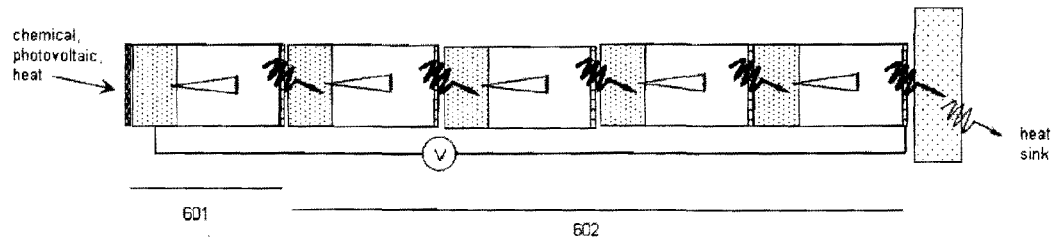
Figure 6

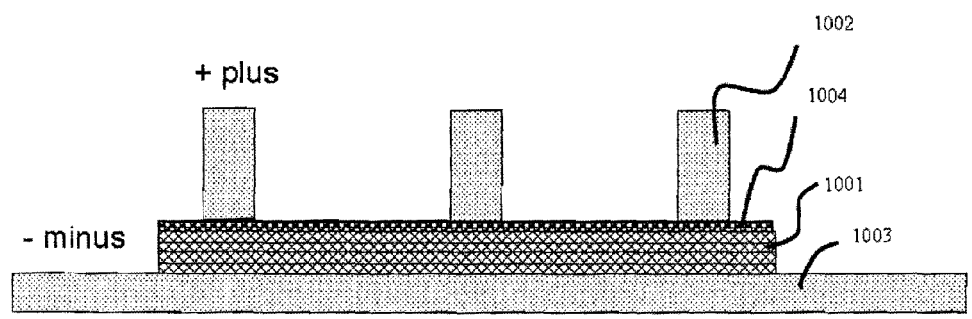
Figure 10-A
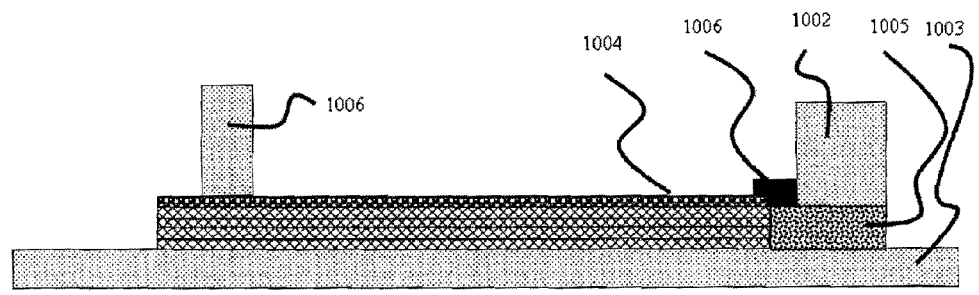
Figure 10-B

Simple stacking, end view

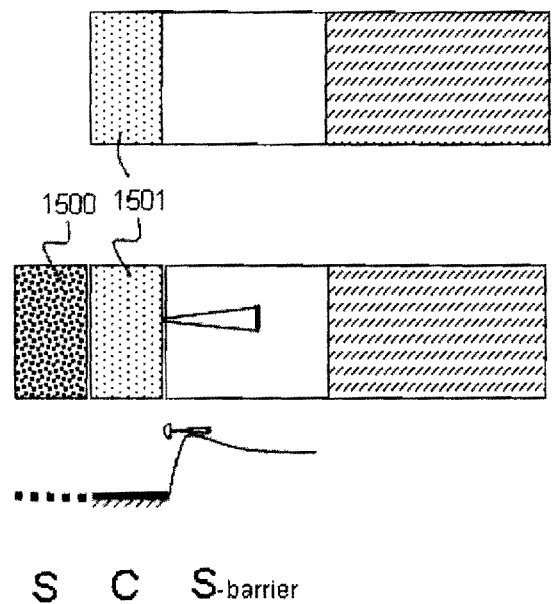
Figure 15-A
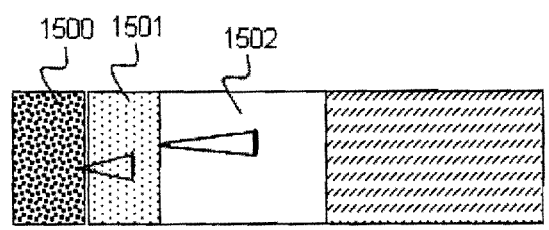
Figure 15-B

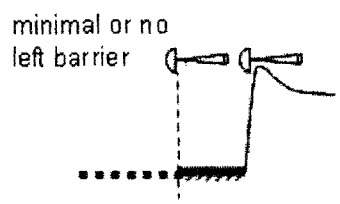
Figure 16-A
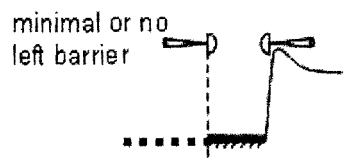
Figure 16-B
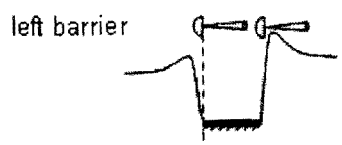
Figure 16-C
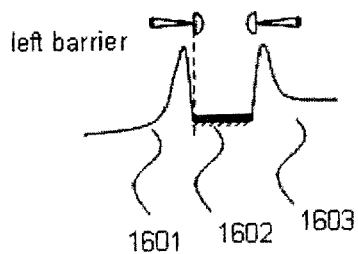
Figure 16-D

SYSTEM AND METHOD FOR USING PRE-EQUILIBRIUM BALLISTIC CHARGE CARRIER REFRACTION

RELATED APPLICATIONS

This application is a Continuation of U.S. patent application Ser. No. 12/650,841, filed Dec. 31, 2009, now U.S. Pat. No. 8,378,207, which is a divisional of U.S. patent application Ser. No. 11/762,864, filed on Jun. 14, 2007, now U.S. Pat. No. 7,663,053, which claims the benefit of U.S. Provisional Patent Application No. 60/883,748, filed on Jan. 5, 2007.

FIELD

The field of the invention relates generally to energy conversion systems and more particularly relates to a method and system for using pre-equilibrium ballistic charge carrier refraction.

BACKGROUND

The use of solid state junctions to convert ballistic charge carrier motion directly into electricity has recently been demonstrated in several novel methods and approaches. As shown in cross section in FIG. 1-A, in each case a charge carrier, most often an electron, is energized on or near a conducting surface 10A by an energizer 12A, such as chemical reactions with or without using conducting catalysts, using photovoltaic energizing materials, or using heat combined with a thermal gradient. In each case the charge carrier ballistically moves from a conductor 10A into a semiconductor or dielectric 11A. The conductor 10A is so thin that the electron effectively travels through it ballistically, without loosing energy or colliding with another electron or atom. The result is a voltage 14A across positive terminal 17A and negative terminal 16A. In FIG. 1-A, the dielectric junction 15A is a semiconductor junction specifically chosen to create an electrical potential voltage barrier which tends to impede the electron ballistic motion, shown as 11B in FIG. 1-B. FIG. 1-B shows the electrical potential in the device as a function of distance along the device. As shown in FIG. 2-A, electrons 21A at the conductor surface 22A have an energy greater than the top of the potential voltage barrier. These electrons 21A cross over the voltage barrier and lose energy to heat 24A before they settle down to the semiconductor conduction band 25A, which separates the charge across the conductor-dielectric junction. Electrons traveling against a potential voltage barrier convert some of the ballistic electron kinetic energy into electrical potential energy 27A. The rest of the ballistic electron kinetic energy becomes heat 24A. The voltage 27A developed is the difference between the Fermi level of the conductor on one side 28A and the Fermi level of the dielectric conductor electrode on the other side 26A. A voltage, V (Volts), is developed when the charges separate.

In a prior art, when energetic chemicals adsorbed on a thin conductor surface, electrons with energies greater than a voltage barrier of about 0.5 eV were detected in sensors similar to those represented by FIGS. 1-A, 1-B and 2-A. However, the energy distribution decreased exponentially beyond ~0.1 eV, rendering the effect not useful for energy conversion and generation. Further, in those sensors the effective electron mass of the metal conductor 10A, of order 1 m_e, is much greater than the effective electron mass in the semiconductor 11A, typically silicon, of order ⅓ m_e. This results in most of the generated electrons being reflected away from the semiconductor/metal interface 15A, and therefore not collected. The relevance or utility of the role of electron effective mass has not been disclosed or expanded. The scheme also required the cryogenic cooling of the diode to reduce thermal noise. The efficiency of this scheme is so low that current can only be measured in the short circuit mode. The system can only be used as a chemical sensor and is not a useful electric generator.

In a prior system, association reactions on or near a conducting catalyst surface energized and initialized highly vibrational excited molecules. The energy of the vibrationally excited molecules was transferred to the electrons in the conductor. The electron energy was apparently in excess of a 1.2 volt barrier 11B. When a wide bandgap oxide semiconductor, $TiO_2$ was used, useful short circuit currents at temperatures well exceeding the boiling point of water, (up to 473 Kelvin) are observed. Useful open circuit forward voltage was observed under conditions of almost zero temperature gradient at room temperature. The forward voltage was similar to that observed in a photovoltaicaly energized system using the same oxide semiconductor.

It would be highly advantageous to use a fabrication method resulting in predictable high output voltages and currents, and to be able to choose materials other than TiO2, to operate such a converter at an elevated temperature and to generate electricity in devices of this type using thermal gradients.

The field of solid state thermionics uses thermal gradients to energize charge carriers and uses semiconductor bandgap engineering to provide voltage barriers across semiconductor junctions. In such devices, charge carriers must travel ballistically through the dielectric 11A. No charge carrier ballistic travel is required in the material 10A. Moreover, it is acknowledged that charge carriers travel in all directions from material 10A towards the dielectric 11A. The effects of a step increase in the carrier effective mass during ballistic transport has not been used to enhance conversion efficiency and lower fabrication costs.

All known related converter concepts suffered an inefficiency directly related to the unspecified and therefore uncontrolled relative charge carrier effective masses of junction materials used. Nowhere does the field claim nor profess to claim any method or knowledge of tailoring or controlling carrier effective masses to enhance energy conversion efficiency.

SUMMARY

A method and system for using pre-equilibrium ballistic charge carrier refraction are disclosed. According to one embodiment, a device comprises one or more solid-state electric generators. The solid-state electric generators include one or more from the group including a chemically energized solid-state electric generator and a thermionic solid-state electric generator. A first material having a first charge carrier effective mass is used in a solid-state junction of a solid-state electric generator. A second material having a second charge carrier effective mass greater than the first charge carrier effective mass forms the solid-state junction. A charge carrier effective mass ratio of the second effective mass divided by the first effective mass is greater than or equal to two.

The above and other preferred features, including various novel details of implementation and combination of elements, will now be more particularly described with reference to the accompanying drawings and pointed out in the claims. It will be understood that the particular methods and systems described herein are shown by way of illustration only and not as limitations. As will be understood by those skilled in the art, the principles and features described herein may be employed in various and numerous embodiments without departing from the scope of the teachings herein.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles of the present teachings.

FIG. 1-A illustrates a prior art solid-state electric generator.

FIG. 1-B illustrates a prior art graph of potential versus distance and indicating the effect of a voltage barrier in a solid-state junction.

FIG. 1-C illustrates a graph of potential versus distance in an exemplary solid-state electric generator having a Schottky barrier.

FIG. 1-D illustrates a graph of potential versus distance in an exemplary solid-state electric generator having a p-n junction potential barrier.

FIG. 1-E illustrates a graph of potential versus distance in an exemplary solid-state electric generator having a conductor-dielectric-conductor nanocapacitor potential barrier.

FIG. 2A illustrates a prior art graph of potential versus distance, indicating the effect of heat in an energy conversion process.

FIG. 2-B illustrates a graph of potential versus distance in an exemplary solid-state electric generator where electrons experience energy loss to heat.

FIG. 2-C illustrates a graph of potential versus distance in a solid-state electric generator where heat re-energizes electrons to leak back across the junction.

FIG. 2-D illustrates a graph of potential versus distance in an exemplary solid-state electric generator with a heat sink.

FIG. 3-A illustrates an exemplary diagram of potential versus distance in a region where a pre-equilibrium ballistic charge carrier moves from a region of low charge carrier effective mass into a region of high charge carrier effective mass.

FIG. 3-B illustrates an exemplary diagram of a single pre-equilibrium ballistic charge carrier refracted into a concentrated angle of travel across a junction FIG. 3-C illustrates an exemplary diagram of multiple pre-equilibrium ballistic charge carriers refracted into a concentrated angle of travel.

FIG. 3-D illustrates an exemplary diagram of multiple charge carriers reflected back towards the junction.

FIG. 4 illustrates an exemplary solid state electric generator using diode pre-equilibrium energy converter with pre-equilibrium ballistic refraction and heat rejection.

FIG. 5 illustrates an exemplary solid-state, in-series, chemically energized pre-equilibrium electric generator, according to one embodiment of the present invention.

FIG. 6 illustrates exemplary electrically and thermally stacked thermal gradient converters using pre-equilibrium energy converters with ballistic refraction.

FIG. 10-A illustrates an exemplary cross section showing inert spacers formed along with ballistic refraction converter assemblies on a supporting substrate.

FIG. 10-B illustrates an exemplary cross section detail of a spacer and ballistic refraction converter assemblies on a supporting substrate.

FIG. 15 illustrates an exemplary addition of materials useful to manage thermal conductivity issues into a low charge carrier effective mass region.

FIG. 16-A illustrates an exemplary device with minimal or no barrier in the first material and an increasing charge carrier effective mass.

FIG. 16-B illustrates an exemplary device with minimal or no barrier in the first material and the middle material having the lowest charge carrier effective mass.

FIG. 16-C illustrates an exemplary device with a barrier in the first material and an increasing charge carrier effective mass.

FIG. 16-D illustrates an exemplary device with potential barriers against charge transport in both directions, and a minimum charge carrier effective mass in the middle material.

DETAILED DESCRIPTION

Figure 7:
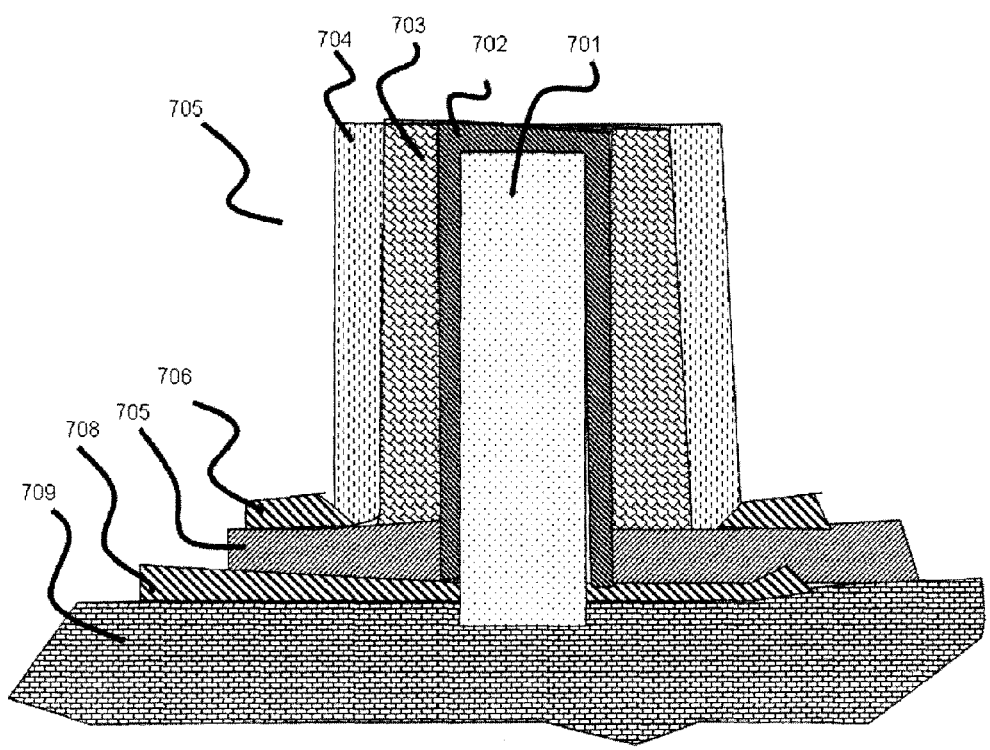
FIG. 7 illustrates an exemplary cross section of a pillar structure on which pre-equilibrium ballistic refraction converters are attached.

Methods, devices and systems for using pre-equilibrium ballistic charge carrier refraction are disclosed. According to one embodiment, a method comprises fabricating one or more solid-state electric generators. The solid-state electric generators include one or more chosen from the group including a chemically energized solid-state electric generator and a thermionic solid-state electric generator. A solid state electric generator energizes a pre-equilibrium energy distribution of charge carriers in a first material having a first charge carrier effective mass and forming a solid-state junction with a second material. The second material has a second charge carrier effective mass greater than the first charge carrier effective mass. A charge carrier effective mass ratio of the second effective mass divided by the first effective mass is greater than or equal to two.

In the following description, for purposes of explanation, specific nomenclature is set forth to provide a thorough understanding of the various inventive concepts disclosed herein. However, it will be apparent to one skilled in the art that these specific details are not required in order to practice the various inventive concepts disclosed herein. The present methods, devices and systems improve the energy conversion efficiency of junctions used in solid-state devices to generate electricity. An energy source creates an unbalanced, pre-equilibrium energy distribution of charge carriers, e.g. electrons, on one side of a junction. When a net excess of charge carriers travel ballistically and surmount an electrical potential barrier upon crossing from one side of a junction to the other, some of the charge carrier kinetic energy associated with motion is directly converted into an electrical potential energy. Charge separation occurs and the regions form a capacitor. In the absence of tunneling, only the velocity component close to the normal to the potential barrier contributes to surmounting the barrier.

The result is the conversion of some pre-equilibrium distribution of energy into the useful form of an electrically charged capacitor. A key element of the embodiments, the efficiency of this process is improved when the directions of the charge carriers are refracted to travel substantially normal to the electrical potential by providing a material with an abrupt increase in the carrier effective mass across the junction. Carriers ballistically traveling backwards, from high to low charge carrier effective mass regions may experience total internal reflection if they approach the junction from any angle greater than a relatively small critical angle. Backward flow tends to drain the separated charges.

Energizing methods which cause a higher effective charge carrier temperature in a material with low charge carrier effective mass compared to the temperature of the high charge carrier effective mass region define a non-isothermal charge carrier distribution, and include transient, pre-equilibrium distributions of charge carriers. Energizing methods include using chemical reactions, using photovoltaic methods, using propagating and/or evanescent electromagnetic radiation, using electric coulomb coupling, using heat flow and associated thermal gradients, using solar energizers, using heat sources such as geothermal, friction, and nuclear heat sources, using nuclear energizing, using in-situ ionizing radiation, using radioactive waste radiation, using flame heaters and catalytic heaters, using piezo-electric energizing and initializing highly vibrationally excited reaction products using energetic chemical reactions.

According to one embodiment, the present system improves energy conversion efficiency by adding a charge carrier effective mass element. The element includes a nanoscopic ballistic carrier refraction effect inherent in ballistic charge transport from a region of lower charge carrier effective mass into a region of higher charge carrier effective mass.

The ratio of the charge carrier effective masses (m_e_high/m_e_low) determines the degree to which the ballistic charge carrier gets refracted towards the potential barrier. This ballistic refraction maximizes the charge carrier velocity component towards and directly against the potential barrier and minimizes the other charge carrier velocity components transverse to the barrier. Minimizing the other components minimizes energy losses. Ballistic transport is assured when the lower charge carrier effective mass region is thin enough to be transparent to charge carrier motion. The lower charge carrier effective mass region forms a nano-layer electrode of the capacitor. The junction of the low and high charge carrier effective mass regions forms a capacitor, which stores electrical potential energy as separated charges. The material with higher carrier effective mass is the dielectric of the capacitor.

According to another embodiment, heat transport across the junction is minimized. Ballistic refraction and a junction electrical potential barrier reflect heat-carrying charge carriers away from the junction. In the low charge carrier effective mass region, carriers with energy less than the barrier potential are reflected back into the hotter region from whence they came. In the high charge carrier effective mass side, carriers approaching the junction with angles greater than the relatively small critical angle (relative to the surface normal) are reflected and can not travel backwards to the low charge carrier effective mass side.

Additional embodiments connect nanoscopic thermal gradient converters thermally in parallel and/or in series and connect them electrically in parallel and/or in series. The connected converters are further connected in parallel and/or in series. The thermal connections can be physically distinct from the electrical connections. The energy and heat sources include those with unique, spatially non-uniform temperature profiles, temporally sporadic and non-constant energy bursts, and various regions may present non-uniform heat flow rates.

According to one embodiment, a secondary energy conversion process is used to extract electrical work by operating a solid state thermionic/thermoelectric heat engine between a higher temperature, such as reject heat from a primary energy conversion process, and the colder temperature heat sink of the ambient surroundings. Efficiency is enhanced by using pre-equilibrium ballistic charge carrier (e.g. electron) refraction (PEBCCR). Heat engine device components utilizing PEBCCR are nanoscopic thermal gradient converters (NTGC). Stacking nanoscopic thermal gradient converters in series thermally and electrically provides an efficient way to implement a heat engine.

According to one embodiment, a system has successive converter units one on top of the other, each converter unit having (a) conductor electrode, (b) low charge carrier effective mass region (also referred to as a nano-layer electrode or nano-electrode), (c) high charge carrier effective mass region (also referred to as the dielectric) and (d) conductor electrode. One preferred embodiment of this nano-electrode capacitor system forms element (b) from conductors such as metals that have relatively long carrier mean free paths, such as Cu, Ag, Au, Al; forms material (c) using oxidized Ti metal to create n-type $TiO_2$; and forms material (a) and (d) from unoxidized Ti. Another embodiment includes a heavily doped n-Si layer between the conductor electrode (a) and the nano-layer electrode (b). Another embodiment forms the element (b) using a heavily doped semiconductor such as n-Si or SiGe alloy. The electrical barrier of this junction is formed by the band offsets, which are approximately 0.1 eV. This favors operation at the maximum power density. Another embodiment includes a heavily doped n-Si layer between the high charge carrier effective mass region (c) and the conductor electrode (d).

According to one embodiment, the thickness of the region of lower charge carrier effective mass is formed so thin that the carriers effectively travel predominantly ballistically. The lower charge carrier effective mass region is formed with one or more materials with a lower thermal conductivity relative to electrical conductivity over nanoscopic dimensions. Materials with a favorable, enhanced, or high ZT thermoelectric figure of merit, values of ZT greater than approximately 0.05, are generally considered to be at least favorable. The region including the lowest charge carrier effective mass material with the other materials is referred to generally as low charge carrier effective mass region.

The methods and systems may be used as a cooler or refrigerator upon application of a potential across the junction. The addition of PEBCCR increases both the cooling efficiency and the cooling rate. The methods and systems may be also be used to alter reaction rates.

One embodiment uses three-dimensional constructs and methods for tailoring heat transfer, cooling and power density and for increasing the active area per volume (volumetric) to enhance the performance made possible by ballistic carrier refraction.

According to one embodiment, using pre-equilibrium ballistic charge carrier refraction enhances energy conversion efficiency in solid state electric generators. The embodiment includes a ballistic charge carrier transport from a region of lower charge carrier effective mass into a region of higher charge carrier effective mass. A ratio of high to low charge carrier effective mass in excess of approximately 2 provides desirable performance enhancement. An absolute high effective carrier mass in excess of approximately 2 will generally provide acceptable performance enhancement. The junction region materials are chosen such that a surmountable electrical potential is formed for charge carriers traveling from the low charge carrier effective mass side to the high charge carrier effective mass side. Any pre-equilibrium effective temperature gradient of charge carriers across the junction enables the energy conversion.

Several configurations utilizing PEBCCR include devices energized by the products of chemical reactions, surface chemical reactions, interactions with highly vibrationally excited molecules, thermal gradients, all forms of electromagnetic coupling such as propagating and/or evanescent radiation, in-situ energizing by nuclear radiation, or other methods.

Pre-Equilibrium Ballistic Charge Carrier Refraction Process (PEBCCRP)

One embodiment of the present teachings uses a combination of a step increase in the charge carrier (electron or hole) effective mass at a material junction and an electrical potential barrier at the junction which tends to retard the charge carrier from traveling into the junction, as shown generally in FIGS. 3-A thru 3-D. The step increase in the charge carrier effective masses refracts the direction of ballistic travel towards the normal to the surface junction. Velocity components transverse to the normal are therefore diminished. In the solid state, these effects occur in the nanoscopic regime where transport is ballistic and the dimensions are less than the charge carrier mean free path, typically ~1-50 nm and preferably >~1 nm. Thickness dimensions greater than 1 nm can be acceptable. Thicknesses greater than 4 nm are desirable. This is referred to as the pre-equilibrium ballistic charge carrier refraction process (PEBCCRP). Devices or device components based on PEBCCRP that convert thermal gradients to electrical potential are referred to as nanoscopic thermal gradient converters (NTGC).

For example, as in FIG. 3-B, an electron crossing from a region of low to a region of high electron effective mass changes direction towards the normal to the region of higher electron effective mass. This is equivalent to the Snell's law effect on light when traveling from a region of low index of refraction (air) to a region of high index of refraction (water or glass), and the governing equations are the same.

One embodiment provides ballistic carrier refraction. Electrons generally move in all directions in a material. Electrons in the low electron effective mass material approaching the interface ballistically from any approaching direction all find themselves traveling nearly entirely forward with a restricted range of angles into the region of higher electron effective mass, as shown in FIG. 3-C. Electrons in the high electron effective mass material ballistically moving backwards into the region of lower electron effective mass are reflected and can not move back unless they approach with angles restricted inside the critical angle, as shown in FIG. 3-D.

Recursive Pre-Equilibrium Ballistic Charge Carrier Refraction (R-PEBCCR)

One embodiment provides a method to recursively connect PEBCCRP and/or nanoscopic thermal gradient converter (NTGC) units where one end of the recursive system is the hottest and the other end of the recursive system is the coldest and attached to a heat sink. Connecting PEBCCRP and/or nanoscopic thermal gradient converter (NTGC) units allows conversion of the heat flow at a higher temperature of a previous PECCRP unit in the recursive system to an electrical potential.

Charge Carrier Effective Mass Discontinuity for Chemically Energized Pre-Equilibrium Electric Generators.

To enhance the energy conversion efficiency of chemically energized pre-equilibrium electric generators, one embodiment of the teachings uses the carrier effective mass discontinuity principle in choosing the material for the junction of lower charge carrier effective mass region with dielectric and electrical potential barrier higher charge carrier effective mass region. The conductor material is chosen such that its charge carrier effective mass is as low as possible compared to the dielectric material whose charge carrier effective mass is as high as material choices permit.

Thermal or Heat Rectifier

One embodiment provides a form of thermal isolation and the resemblance to heat rectification. Almost all of the thermal conductivity in most conductors is associated with (charge carrier) electron flow, not with phonon or lattice vibrations. The ballistic charge carrier refraction permits charge carriers approaching from the low charge carrier effective mass side material to transport electrical energy, and hence heat, directly into the high charge carrier effective mass side material. The total internal reflection in the high charge carrier effective mass side material greatly reduces electrical energy flow backwards, and therefore also minimizes heat energy flow backwards. Consistent with the Second Law of Thermodynamics, this is analogous to the total internal reflection of binocular prisms and certain reflective coatings used for thermal insulation.

Heat Sink and Energy Losses

One embodiment converts a fraction of the ballistic charge carrier motion into electrical potential energy. Energy conversion from ballistic charge carrier motion into electrical potential occurs when charges are separated after surmounting an electrical potential barrier. The potential barrier can be formed in any one of many ways, for example, a Schottky barrier, FIG. 1-C, a p-n junction FIG. 1-D and a conductor-dielectric-conductor nanocapacitor FIG. 1-E.

A forward biased diode provides one of the simplest methods to implement this energy converting nano-layer electrode capacitor. FIG. 1-C depicts a forward biased Schottky diode whose positive terminal, a conductor, is the nano-layer electrode and whose junction capacitance forms the capacitor. FIG. 1-D depicts a forward biased p-n junction diode. A nano-layer electrode forms one side of the capacitor, the p-type semiconductor forms the dielectric of the capacitor, and the n-type semiconductor forms the other conductor of the capacitor. FIG. 1-E depicts a conductor-dielectric-conductor capacitor, where the nano-layer electrode forms one side of the capacitor and an insulator forms the dielectric of the capacitor. The devices can all be generally described as energy converting nano-layer electrode capacitors.

In all these energy-converter nano-layer electrode capacitors, minimizing conduction across the capacitor in the forward bias direction increases the efficiency of energy conversion. In contrast, a good diode maximizes conduction in the forward bias direction.

One conduction property of a diode is characterized by the property referred to as an "ideality factor", "n". The ideality factor of 1.0 describes a theoretically optimized diode, and values greater than 1 are less ideal. The smallest n close to unity is best for a diode. Ideality factors of 1.5 and greater generally reduce forward conduction and are not generally regarded as "good" for a diode. A good capacitor requires the exact opposite of the diode and requires such minimizing of conduction in the forward bias direction.

One way to minimize conduction of a forward biased diode used as an energy-converter nano-layer electrode capacitor is to tailor the diode ideality property to be large to minimize the forward current. Minimizing forward current is achieved by favoring diodes with ideality factors, n, greater than unity. Calculations show that diodes with ideality as low as 1.2 can enable a 50 Celsius increase in reaction temperature, which can result in an order of magnitude increase in reaction rates. Diodes with ideality >2 can enable more than 150 Celsius increase in reaction temperature.

Tailoring diodes to have relatively high generation-recombination (R-G) currents tends to result in ideality factors approaching n=2. Forming diodes with a large state density due to metal interdiffusion and dangling bonds is a way to increase ideality. Forming diodes with high defect density results in diodes with n>2. Diodes with significant Poole-Frenkel tunneling transport and trap-assisted tunneling transport both increases n. Good diodes are not good capacitors, and vice versa. We emphasize the objective is to achieve the highest "fill factor" for the energy conversion.

Thermionic models of Schottky diodes use "effective Richardson constant" as a multiplying factor for the diode forward current. Minimizing the effective Richardson constant is also a way to minimize diode forward conduction. The methods of our invention include the methods to maximize ideality and choosing semiconductors known to have relatively small effective Richardson constants, e.g. less than approximately 10 amp/cm$^2$-Kelvin$^2$. For example, TiO$_2$ has a Richardson constant less than 0.05 amp/cm$^2$-Kelvin$^2$Kelvin$^2$. Using ballistic refraction in diode junctions can be an effective method to reduce effective Richardson constants.

To tailor solid state junctions, bandgap engineering, degenerative doping, doping gradients and composition gradients are effective in optimizing the charge separation property of the junction. Potential barriers may be tailored to enhance tunneling and resonant tunneling through the junction by narrowing and shaping the junction. Shaping includes forming periodic or almost periodic electrical potential barriers using quantum well superlattice structures. Barriers may be tailored to enhance carrier diffusion in the direction of charge separation by deliberately tailoring a sloping junction potential.

Embodiments remove reject heat in various ways, e.g. 3 D constructions. Embodiments stack and connect planar devices to maximize power density.

Pre-Equilibrium Ballistic Refraction Energy Converter

Referring to FIG. 4, one embodiment uses chemically energized, pre-equilibrium hot carriers as the first source of energy and converts the energy using pre-equilibrium ballistic charge carrier refraction process coupled with a heat sink. Another embodiment adds one or more stacked nanoscopic thermal gradient converters to convert reject heat from the chemically energized conversion step to electrical potential.

Referring to FIG. 4, chemical reactants in a region bounded in part by a surface 401 containing a catalyst may react in the vicinity of the surface, may contact, adsorb, dissociate, recombine, or form reaction intermediates on, near or in the vicinity of the surface 401. Reactions typically form highly vibrationally excited intermediates and products. Highly vibrationally excited products have been recently shown to transfer a major fraction of their vibrational energy directly to an electron in the first conductor encountered.

One embodiment initializes highly vibrationally excited products directly on or near a conductor to energize a pre-equilibrium ballistic refraction energy converter conceptually shown in FIG. 4 and FIG. 5, 505-508. In one embodiment, the catalyst conductor 505 is part of the device and promotes association reactions directly on or near the catalyst conductor. As a result, highly vibrationally molecules are initialized directly on or near the conductor 505. Approximately one electron per association reaction is energized with energy sufficient to surmount 0.5-1.2 eV barriers in various conductor-dielectric junctions. The energy distribution of the ballistically transported electrons in the conductor during the compressed phase of vibration is peaked about the higher energies. Adsorbtion reactions are similar to molecular association reactions and result in similar energy transfer, but with an exponentially decreasing distribution. Charge transfer associated with precursor mediated adsorbtions are associated with charged intermediates, such as peroxo and superoxo adsorbates, which have short residence times on the surface and in some cases also energize and emit energetic electrons. Highly vibrationally energized gas specie transfer vibrational kinetic energy to energize electrons in the surface conductors 505.

The dielectric and electric potential barrier material 403 in this device is chosen to have a large charge carrier effective mass, such as semiconductor TiO$_2$, compared to the conductor. TiO$_2$ is one of at least several semiconductors known to have charge carrier effective mass greater than 2. The charge carrier effective mass of TiO$_2$ has been measured under various conditions to be in the range 5-200 m_e, with probable values ~25 m_e. Therefore, nearly all the carriers energized in the nano-electrode conductor 402 are refracted to have a direction nearly normal to the Schottky barrier formed by the conductor 402 and the highest charge carrier effective mass material, e.g. TiO$_2$ dielectric semiconductor 403. Electric potential is observed between negative electrode 406 and positive electrode 407. Both conductor and electrode materials include materials chosen from the group including at least a conductor such as a metal, a conducting oxide, and degeneratively and heavily doped semiconductors such as heavily doped silicon, and semiconductors, materials with a high ZT figure of merit. Heat generated by the reactions and by the Schottky junction energy converter is rejected into a colder temperature heat sink 405.

The lower temperature heat sink may comprise the reactants 400 themselves, because the reactants in this device are generally not hot when supplied to the system.

One embodiment includes using dielectric or semiconductor 403 other than TiO$_2$ with higher than unity carrier effective mass, including but not limited to, for example, rutile TiO2, anatase TiO2, porous anatase TiO2, SrTiO$_3$, BaTiO3, Sr_x-Ba_y-TiO_z, LiNiO, and LaSrVO$_3$, and certain organic semiconductors, such as PTCDA, or 3,4,9,10-perylenetetracarboxylicacid-dianhydride. The subscripts x, y and z denote concentrations, per usual conventions. One advantage of SrTiO$_3$ is that Schottky barriers on it may be unpinned, providing a relatively larger barrier compared to that of TiO$_2$.

One embodiment includes providing a direct heat sink 405 to the dielectric 403. Such heat sinks can include but are not limited to heat pipes, capillary systems with fluid flow, evaporative cooling including but not limited to using reactants themselves, heat conductive materials and convective flow methods, and a nanoscopic thermal gradient converter.

Nanoscopic Thermal Gradient Converter (NTGC)

One embodiment is a device based on the pre-equilibrium ballistic charge carrier refraction process: a nanoscopic thermal gradient converter. In one embodiment, shown in FIG. 5, elements 501-503 are a Surface Nanoscopic Thermal Gradient Converter (SNTGC), while element 703 of FIG. 7 is a Volumetric Nanoscopic Thermal Gradient Converter (VNTGC). The junction providing an electrical retarding potential between the materials may include at least a conductor-dielectric, dielectric-dielectric, or a dielectric-conductor-dielectric junction. Insulators and semimetals are considered subsets of dielectrics and metals here. Elements 501-503 of FIG. 5 show an example schematic layout of conductor-semiconductor junction in a nanoscopic thermal gradient converter.

The term "semiconductor junction" includes semiconductor junctions, junctions including quantum wells formed of metal and/or semiconductor, insulator materials with a large bandgap and low doped and amorphous materials, semimetal, insulator, amorphous material, polycrystalline material. The term "metal" includes heavily doped semiconductors, metal, semimetal, heavily doped semiconductor, electrical conductor. In all the cases related to pre-equilibrium charge carrier ballistic refraction energy conversion processes, the guiding principal is that the junction presents both a retarding and surmountable and/or tunneling potential to the approaching ballistic charge carrier, and an increase in carrier effective mass.

Referring to FIG. 5, one embodiment adds a nanoscopic thermal gradient converter 501-503 to the chemically energized pre-equilibrium electric generator 505-508. Heat 500 rejected by the hotter, chemically energized pre-equilibrium electric generator 505-508 (the primary energy conversion system), energizes electrons at the input side 501 of the nanoscopic thermal gradient converter 501-503 (the secondary energy conversion system). In a configuration including other primary energy conversion systems in general, nanoscopic thermal gradient converters are connected in series thermally and electrically. This interconnection referred to as "series-parallel" does not preclude series parallel configurations used to assure reliability. For example, the negative electrode 508 of the chemically energized generator is electrically and thermally coupled to the positive electrode of low charge carrier effective mass region 501 of the nanoscopic thermal gradient converter. The negative electrode 503 and the high carrier effective mass material 502 of the thermal gradient converter are coupled thermally to the colder, heat sink 510. Electricity is taken from the positive electrode of 506 and the negative electrode 503, and because the devices are in series for this example, also from positive electrode of 501 and negative electrode 503. Note the output voltage may be tapped from any of the positive and negative electrode pairs. Note that such multiple outputs are highly advantageous.

This configuration permits the chemically energized generator to operate at a higher catalyst temperature than without the nanoscopic thermal gradient converter, permitting an increase in reaction rates and therefore higher power density. The increased temperature also permits use of a wider range of reactants and operation at the ignition temperature of some reactants.

Recursive Nanoscopic Thermal Gradient Converters

Referring to FIG. 6, one embodiment recursively repeats nanoscopic thermal gradient converters, each connected in series to the next both electrically and thermally. The first stage 601 can be an electric generator energized by any of the many known methods The recursively repeated nanoscopic thermal gradient converters 602 then generate electricity from the higher temperature reject heat of the first stage 601 and the lower temperature ambient heat sink. Estimates suggest that a recursively repeated nanoscopic thermal gradient converter can achieve ~80% of the Carnot limit efficiency between its heat source and heat sink temperatures.

Note again, an output voltage may be tapped from any of the positive and negative electrode pairs.

Ballistic Refraction Energy Converters

One generalized embodiment is the surface ballistic refraction energy converter. Another is the volumetric ballistic refraction energy converter. Other forms and combinations may also be used.

The term "volumetric" refers to configuration where the active surfaces and reactant and coolant flow channels are formed on or using three dimensional structures.

Surface Ballistic Refraction Energy Converter (SBREC)

One embodiment uses a primary energy converter attached to a series of secondary nanoscopic thermal gradient converters attached to a heat sink. FIG. 6 shows such a typical surface ballistic refraction energy converter. A number of secondary nanoscopic thermal gradient converters 602 are connected in series. One end of the series 602 is attached to a heat sink 603. The other end of the series 602 is connected to a primary energy converter 601 based on the pre-equilibrium ballistic charge carrier refraction process. The primary energy converter may be energized by chemical reactions, thermal gradients, photo-voltaic or other means. The number of components 602 may be from 0 to a desired number, both inclusive. The main function of the components of 602 is to convert a fraction of the reject heat energy from the previously connected energy conversion component to an electrical potential.

One embodiment includes a primary converter 601, with a step increase in charge carrier mass between the junction materials, where the electrons are energized by chemical reactions on or near the conducting surface, with 0 to desired number of nanoscopic thermal gradient converters 602 connected in series electrically and thermally and attached to a heat sink.

One embodiment includes a primary converter 601, without a step increase in charge carrier mass between the junction materials, where the electrons are energized by chemical reactions on or near the conducting surface, with one to a desired number of nanoscopic thermal gradient converters 602 connected in series electrically and thermally and attached to a heat sink.

One embodiment includes a primary converter 601, using a photo-voltaic energy source with or without the step increase in charge carrier mass between the junction materials, and with one to a desired number of nanoscopic thermal gradient converters 602 connected in series electrically and thermally and attached to a heat sink.

One embodiment includes a primary converter 601, a thermionic energy converter where charge carrier ballistic transport occurs in the first material instead of the second material, with zero to a desired number of nanoscopic thermal gradient converters 602 connected in series electrically and thermally and attached to a heat sink.

One embodiment includes a primary converter 601, a thermionic energy converter with a second material effective charge carrier mass greater than the first material charge carrier mass, with 0 to desired number of nanoscopic thermal gradient converters 602 connected in series electrically and thermally and attached to a heat sink.

One embodiment includes a primary converter 601, a thermionic energy converter with a second material effective charge carrier mass greater than the first material charge carrier mass and where charge carrier ballistic transport occurs in the first material instead of the second material, with 0 to desired number of nanoscopic thermal gradient converters 602 connected in series electrically and thermally and attached to a heat sink.

One embodiment includes a primary converter 601, attached to a series of nanoscopic thermal gradient converters 602, one or more of which may include a dielecrtic-conductor-dielecrtic junction for the region generally referred to as the low carrier effective mass region, and connected in series electrically and thermally and attached to a heat sink. The number of nanoscopic thermal gradient converters may be from 0 to the number desired, both inclusive.

Volumetric Ballistic Refraction Energy Converter (VBREC)

One embodiment includes volumetric ballistic refraction energy converters on a pillar-like form. A desirable feature of the pillar is a high area per length, which results in a high volume power density resulting from the pillar's relatively large area per volume. The cross section of such a high area pillar may include deep corrugations, holes and pits, all of which may be irregular. The cross section of a pillar is limited mainly by the constraints imposed by the converters formed on it and has no general constraints. For example, the cross section may be any combination from the group including at least: wire-like, circular, bar-like, square, rectangular, irregular, wrinkled, sponge-like, a truncated cone, a tapered cone, and a cross section like that of wings or other aerodynamic forms.

Referring to FIG. 7, the pillar itself 701 can be can be any material, such as strands, fibers, strips formed with one or more materials each chosen for their strength, thermal conductivity, electrical conductivity, or any other desirable property.

A pillar would first be at least partly coated with a conductor 702 to form the back electrode of the device. Then as many as required secondary nanoscopic thermal gradient converters 703 are formed over the pillar and under a final primary energy converter 704, with or without a step increase in charge carrier mass between the junction materials. The primary energy converter 704 may be energized either chemically, photo-voltaically, by thermal gradients or other means. The outer region 705 is the source energizing region. The number of units 703 range from zero to the required number, both inclusive. The positive electrode connection 706 is in electrical contact with the final converter 704. An insulator 707 separates the positive electrode connection 706 from the negative electrode connection 708, which is in electrical contact with the conductor 702. Heat sink can be provided by the reactants and gasses surrounding the pillar region 705 and or by the substrate 709 which can be physically connected to a heat sink.

One embodiment includes a primary converter 704 where the electrons are energized by chemical reactions on or near the conducting surface, with 0 to a desired number of nanoscopic thermal gradient converters connected in series electrically and thermally and attached to a heat sink.

One embodiment includes a primary converter 704, a photo-voltaic energy converter with 0 to a desired number of nanoscopic thermal gradient converters connected in series electrically and thermally and attached to a heat sink.

One embodiment includes a primary converter 704, a thermionic energy converter with 0 to a desired number of nanoscopic thermal gradient converters connected in series electrically and thermally and attached to a heat sink.

One embodiment includes long mean free path semiconductors as well as long mean free path metals as the materials forming the minimum charge carrier effective mass region. Band gap alignments may be used to form potential barriers.

One embodiment includes a primary converter 704, a solid state thermal gradient energy converter using a dilectric-conductor-dilectric junction attached to a series of similar nanoscopic thermal gradient converters connected in series electrically and thermally and attached to a heat sink. The number of nanoscopic thermal gradient converters may be from 0 to the number desired, both inclusive.

In general, ballistic refraction energy converters can be attached to various kinds of objects, including to devices used to cause reactant flow, air flow, and cooling, such as such fan blades. It can take the form of a sheet following the contour of the objects. For example, the converters can be "coated" on to the air flow system. Alternatively, the converters can be separately made and "pasted" on to the system. Or, they can be integral to the system.

Placing ballistic refraction energy converters directly on the fan blade maximizes the efficiency with which the fan provides cooling, heat transfer and heat removal.

Figure 8:
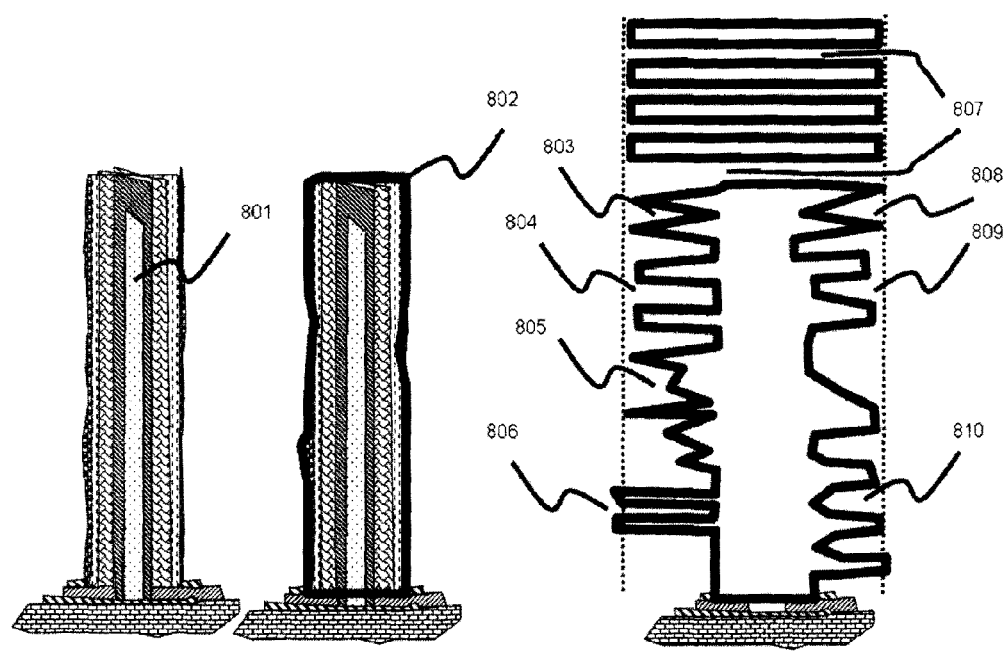
FIG. 8 illustrates an exemplary cross section of a generalized pillar structure that includes multiple forms such as corrugations, channels, pores and holes on which ballistic refraction converter assemblies are affixed.

As suggested by FIG. 8, ballistic refraction energy converters 801 affixed to the pillar with cross section profile 802 may be any shape consistent with the requirements for making the ballistic refraction energy converters. A large energy collection area is desirable and may be achieved in many ways, including forming the profile to include long, thin forms 802, wedges 803, channels 804, irregular polygonal sides 805, deep narrow channels or pores 806, pores that completely go through the pillar 807, symmetric forms 808 and 803, almost symmetric forms 809, and smoothly symmetric forms 810.

Pores can take the form of deep holes into the stack 804, or as holes that go entirely through the stack 807.

Wire Geometry

One embodiment forms a converter geometry resembling a long thin device such as a wire 802. The converter wire can be preformed and poked into the surface or otherwise attached to the surface in regular or irregular patterns.

Flow Geometry

Figure 9:
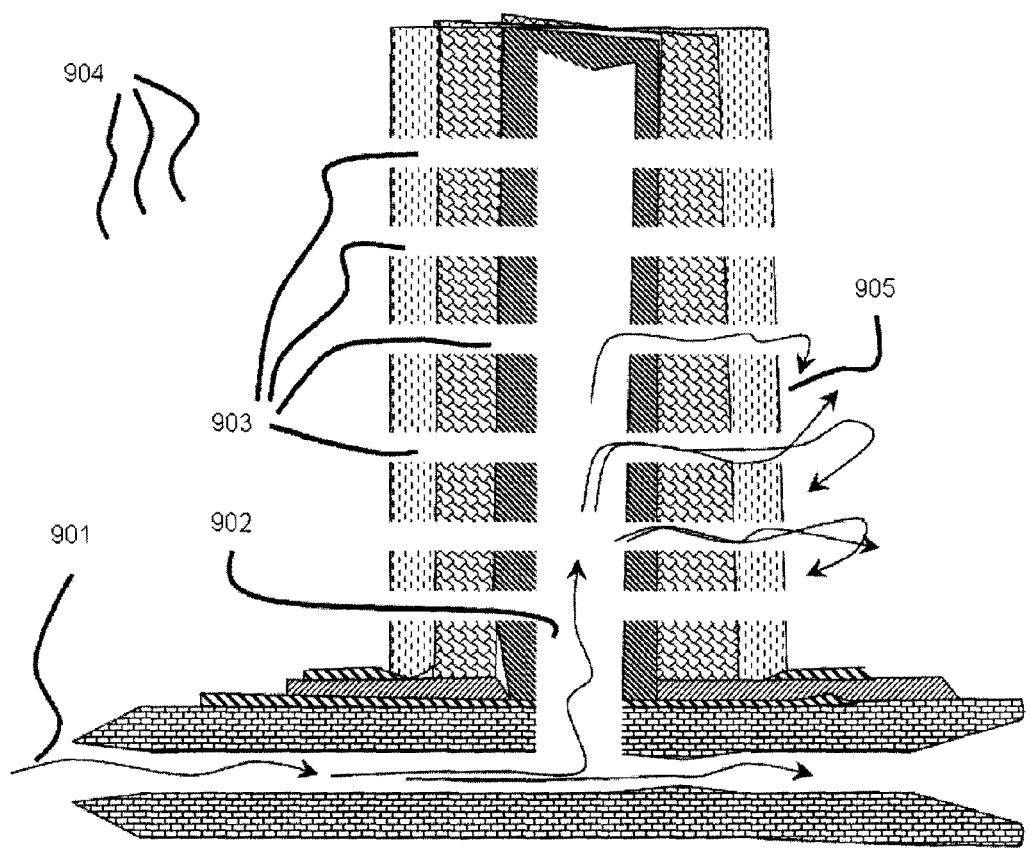
FIG. 9 illustrates an exemplary cross section showing reactant and coolant flow from coldest (inside of structure) to hottest (outside of structure) on which pre-equilibrium ballistic refraction converter assemblies are affixed.

One embodiment provides a heat sink for ballistic refraction energy converters. A heat sink for cooling can be achieved in many ways, including by convective flow, phase change or evaporative cooling, and heat pipes. Reactants or reactant components may be used. For example, FIG. 9 illustrates an embodiment using channels, ducts or pipes associated with the structure supporting the converters and with the interior of the converter assembly, through which coolant may flow, reactants may flow, additives may flow, or any combination of these materials may flow. Each case has its advantages. Materials 901 flow from the colder side 902, through pores or holes 903 to the hot region 904. Both the cold side 902 and the hot side 904 may include reactants or additives, and the hot side is associated with both exhausts and air flow.

Evaporation of reactants 901 on the cold side 902 as well as the flow of colder materials 901 causes cooling. Reactants 901 can be concentrated and fuel rich near the stack hot surface 905.

Using liquid reactants or evaporative coolant 901 that becomes gas upon contact with warmer, reaction surface 905 provides a desirable gas specie for chemically energized hot electron processes.

One embodiment forms converters directly on aerodynamic surfaces. This permits both direct generation of electricity as well as using the gas generated by the liquid-gas transformation as mass flow to push a turbine or other mechanical extraction of useful work and generation of shaft energy.

One embodiment uses liquid air and other liquid gasses 901 for their low temperature heat sink in an electric generator. Liquid air and similar inert liquid gasses may provide a heat sink to the region 902, the ambient air in the exhaust region 904 may provide the heat source, and the device may thereby generate electricity directly using the temperature difference. The liquid/gas phase transition may also operate a mechanical energy converter such as a turbine, at the same time.

One embodiment uses natural convection to provide air flow. It is noted that the cooling air volume can typically be orders of magnitude greater than the reaction air volume.

One embodiment based on FIG. 9 may also represent the cross section of generalized tube geometry, such as flattened tubes. A generalized tube is coated on one or more faces with ballistic refraction energy converters. "Tube" here refers to something with any partly hollow geometry, with any relative wall thickness, including non-uniform walls. For example, a tube can be flattened so that it looks like two sheets with an enclosed space between them to allow gas or fluid flow and with the volume enclosed at the edges. Note that the concepts of FIG. 9 could be used in surface as well as volumetric devices (SBREC and VBREC).

Stacking Geometry

Referring to FIG. 10, an elementary stackable unit is placed on a structure that includes one or more of the electrically conducting layer, thermally conducting layer, and the structural support layer.

Embodiments connect and stack together more than one ballistic refraction energy converter (surface (SBREC), or volumetric (VBREC)) assembly to create a volume of electric generators instead of just an area provided by the surface of a single converter assembly. The stacks can be connected electrically in series or parallel.

One embodiment of an elementary stackable unit, shown in cross section in FIG. 10, includes the key element: ballistic refraction energy converter assembly 1001 (which may comprise of primary only or primary and secondary energy converters) to be connected electrically with positive and energized side 1004 up and negative side down. The ballistic refraction energy converters are supported and connected with positive electrode connection 1002, negative electrode connection 1003. Structure 1003, which may include one or more of an electrically conducting element, a thermally conducting element and a strength structure element. Stacking involves placing the elementary stackable unit on top of other elementary stackable units, leaving a space above the active surface of the converter 1001 for energizing and heat sources. The same may be accomplished in any workable configuration or arrangement.

Figure 11:
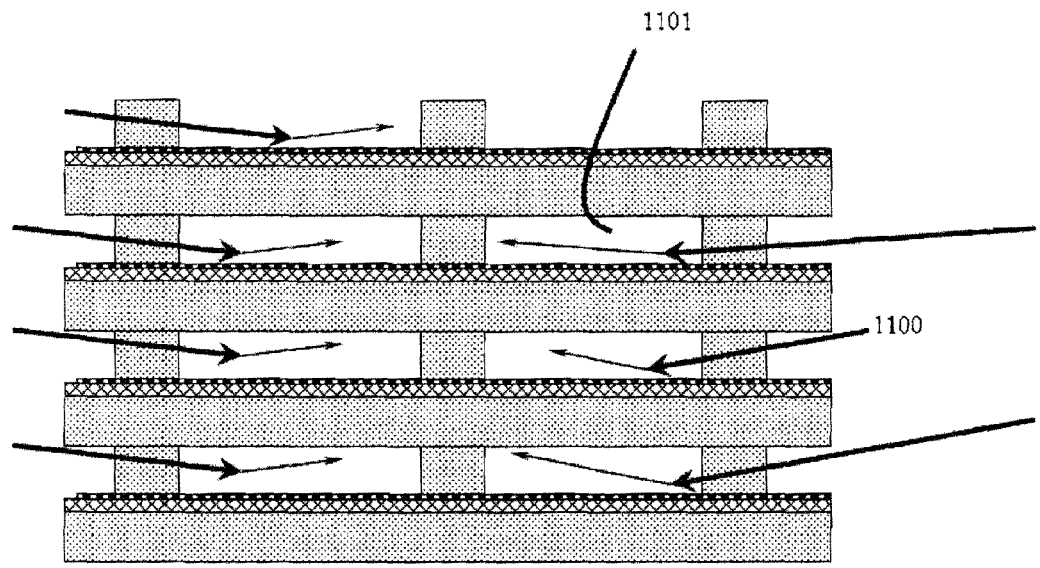
FIG. 11 illustrates an exemplary cross section showing stacking of substrates containing ballistic refraction converter assemblies and showing reactant, cooling and exhaust flows in the spaces between stacked elements.

The embodiment shown in FIG. 10 connects the positive electrode 1002 to the negative electrode 1003 of the converter above it. A cross section of this is shown in FIG. 11. Note that each elemental structure of FIG. 11 may be recursively stacked in the vertical and/or in the horizontal direction to form a matrix of the three-dimensional elemental stacked structures.

FIG. 10-*b* provides detail related to electrical and thermal connections and interfaces that have been deliberately left out for clarity in the embodiments.

Referring to FIG. 10-*b*, for example, the positive electrode-1002 would not be directly placed on the active surface of the converter 1001 as shown because the active surface is typically a nanometers-thick structure that is easily damaged. In practice, those generally skilled in the art would use one of many known methods to connect the electrode to the converter. One embodiment places the positive electrode 1002 on an insulator 1005 formed directly on the structure 1003 and then an electrical bridge 1006 is formed to electrically connect the positive electrode 1002 to the positive end and active surface 1004 of the ballistic refraction converter assembly. The structure element 1003 would in practice include an electrical conductor connected to the negative side of the converter and would also include a thermal connection to the converter. A simple embodiment forms the structure 1003 to be both electrically and thermally conducting, for example a 5 micron thick aluminum or copper foil.

One embodiment stacks the elementary stackable units shown in FIG. 10 on top of each other, forming a volume of electric generator energy converters. Reactants and coolants 1100 flow into the spaces 1101 between the stacks and exhausts flow out through the spaces.

Figure 12:
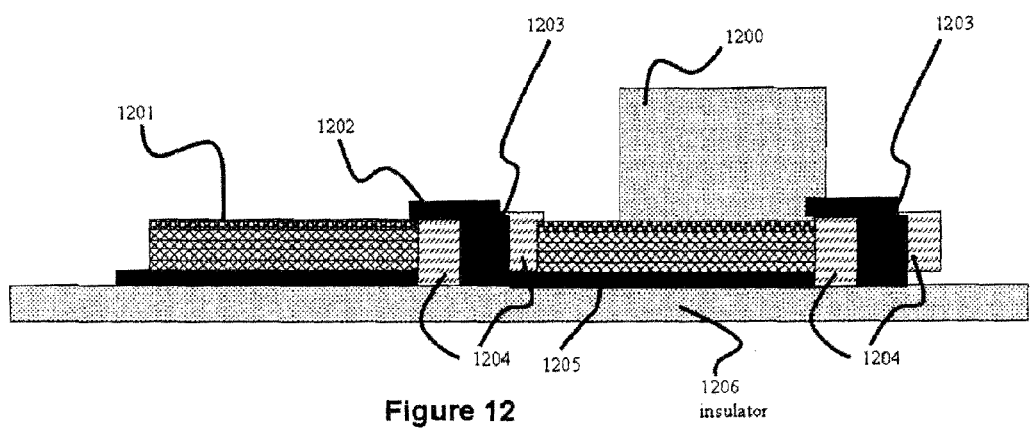
FIG. 12 illustrates an exemplary cross section showing pre-equilibrium ballistic refraction converter assemblies connected electrically in series across the surface of a supporting structure.

One embodiment connects the converters in series along the plane of the stack by connecting the positive electrode to the negative electrode of adjacent converters in the same plane. This can be accomplished several ways, one of which is shown in FIG. 12. An electrical connection 1202 is made to the positive side and active surface of a first converter 1201 and is connected to an interconnecting conductor 1203 isolated by insulators 1204. The interconnect 1203 electrically contacts the negative side 1205 of a second converter. The insulating spacer 1200 is shown conceptually behind a converter in the figure.

Figure 13:
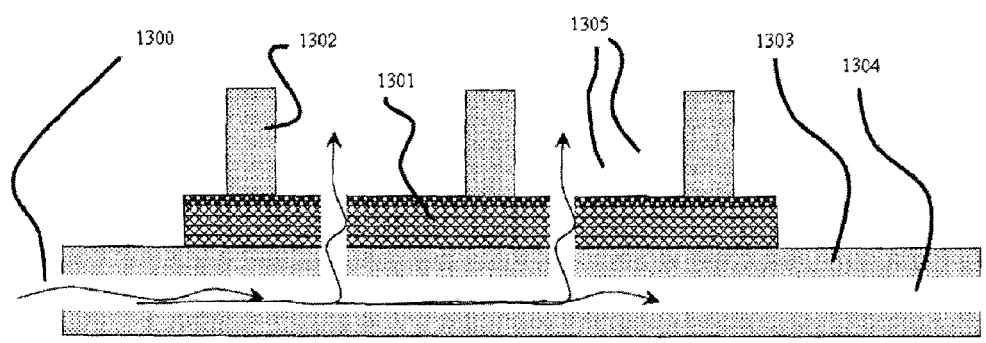
FIG. 13 illustrates an exemplary cross section showing a substrate with reactant and coolants flowing through a supporting structure and around ballistic refraction converter assemblies on the structure.
Figure 18:
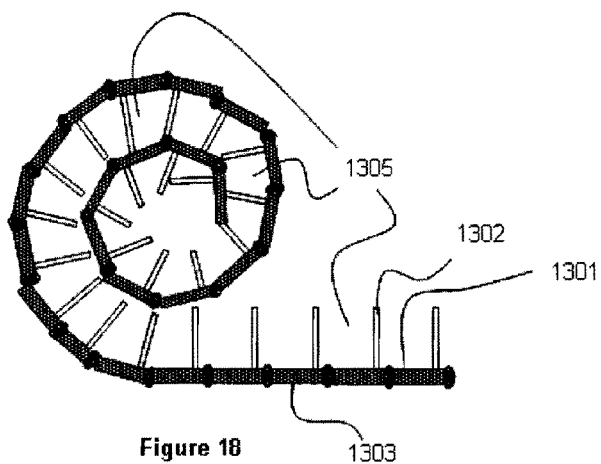
FIG. 18 illustrates an exemplary surface containing ballistic refraction converters and spacers being rolled, permitting reactant and coolant flow through the roll.

One embodiment provides coolants and/or reactants 1300 through the body of an elementary stackable unit, as sketched in FIG. 13. For example, ballistic refraction energy converters 1301 and spacers 1302 are formed on a structure and substrate 1303 inside of which 1304 flow reactants and/or coolants 1300. Referring to FIG. 18, the device of this embodiment can be rolled up and the spaces 1305 between the roll formed by spacers 1302 permit reactants to flow into and exhausts can flow out of the spaces 1305. The spacers and electrical interconnects are shown in FIG. 13 for clarity. Detailed connections could also be like those explained in FIG. 12 and FIG. 10-*b*.

In each of these embodiments, the converters can take on many forms, including the pillar forms described above, and can be attached on many surfaces of nearly arbitrary shapes.

Tunneling Cluster Catalysts

Figure 14:
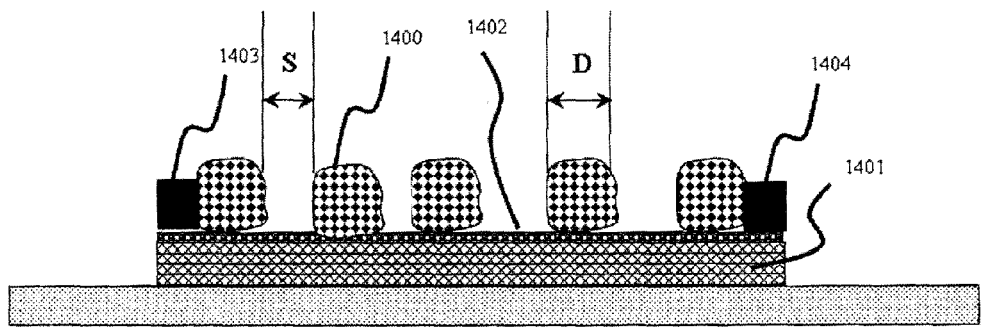
FIG. 14 illustrates an exemplary cross section of clusters electrically connected predominantly by tunneling and physically separated on an energy converter.

One embodiment uses physically disconnected, electrically tunneling connected nanoscopic catalyst clusters to enhance the effective temperature gradient of excitations on the active surface of a ballistic refraction energy converter. FIG. 14 schematically shows conductor catalyst structures 1400 with typical dimension D and typical separation S on the converter 1401 with active surface 1402. The dimension D is formed to be less than the mean free path for hot carriers in the cluster 1400, chosen to allow the carrier transit time to be shorter than the period of the highest lattice vibration of the cluster 1400 and hence decouples carrier temperature from lattice temperature. This dimension is typically in the range of order 4 to 50 nm in materials such as Cu, Ag, Au, Pd, and Pd. The cluster separation D is chosen to be small enough to permit charge carrier electron tunneling between clusters 1400. This dimension is typically in the range 1-20 nm. Electrical connections to the cluster are formed by electrical conductor contacts 1403 and 1404. In an ideal case, the disconnected clusters are formed on a low electrical conductivity and low thermal conductivity material. This cluster arrangement can then form a Schottky barrier with the converter

1401, permitting the clusters to be an integral part of a ballistic refraction energy converter.

One embodiment uses the enhanced catalyst activity of catalyst clusters in contact with ceramic substrates such as converter material. One embodiment uses the enhanced cluster electron temperature to increase reaction rates and therefore increased power output. One embodiment applies an electrical potential across electrodes 1403-1404, which has been shown to heat the clusters to temperatures (~2000 K-5000 K) far in excess the substrate temperature (~300 K) and hence can greatly increase reaction power without increasing converter diode temperature.

Coupling and Conversion Layers

One embodiment uses a quantum well superlattice for the lowest charge carrier effective mass material. To maximize conversion efficiency, the superlattice is tailored such that it filters carriers with energies slightly greater than the barrier height from the low carrier effective mass region to the high carrier effective mass region.

One embodiment forms closely spaced buss bars on the active surface to minimize ohmic losses across the surface. Chemically inactive buss bars are formed as close as 100 nm apart, with active material such as tunneling cluster catalysts between the buss bars.

One embodiment uses very thin semiconductor for the barrier-presenting material. The minimum thickness is typically of order 5 nm. A preferable semiconductor thickness is in the range between 20 and 100 nm although other thicknesses are contemplated.

Thermal Conductivity Management

Referring to FIG. 15, one embodiment tailors the lower charge carrier effective mass region 1500-1501 to include elements for controlling and limiting the transfer of heat, and enhancing the transfer of charge carrier kinetic energy. These elements include one or more of low thermal conductivity materials, long carrier mean free path materials, thermal diode elements, quantum confinement elements and graded carrier effective mass elements. The principle is to present multiple regions of increasing carrier effective mass to the charge carrier as it travels ballistically towards the barrier region. FIG. 15 show two such regions 1500, 1501.

Referring to FIG. 15, one embodiment uses a semiconductor (S) 1500 with a charge carrier effective mass as low as practical, such as silicon with a charge carrier effective mass ~0.3 $m\_e$ in contact with a conductor (C) 1501 with a higher charge carrier effective mass and known to have unusually long electron mean free paths at ~1 eV. Such conductors 1501 include, for example, Au (~20-100 nm), Ag (~20 nm) and Cu (reported as high as 60 nm) and Al (~20 nm). A ballistic charge carrier refraction effect then exists between the semiconductor 1500 and the conductor 1501. The semiconductor 1500 may then inject its hotter charge carriers via a narrow range of directions into the conductor C 1501. The conductor C 1501 is chosen to have a thickness less than approximately 2 times a charge carrier mean free path. Nearly all charge carriers traveling through the conductor C 1501 are already directed towards the semiconductor S_barrier 1502, for example TiO$_2$ with charge carrier effective mass ~25 $m\_e$, higher than 1501 charge carrier effective mass.

Materials with electron effective mass less than 1.1 and materials with relatively long electron mean free paths can be used for either semiconductor 1500 or lowest charge carrier effective mass material 1500, including, but not limited to: air, aluminum, conducting carbon nanotubes, conductors, copper, degenerately doped materials, gasseous material, gold, metals, metals, molybdenum, nickel, palladium, platinum, rhodium, ruthenium, silver, tantalum, vacuum. The materials with a ZT figure of merit greater than approximately 0.05 and generally preferred for thermoelectric applications may also be used for lowest charge carrier effective mass material 1500, including but not limited to: aluminum antimonide (AlSb), aluminum arsenide (AlAs), aluminum gallium nitride (AlxGa1-xN), bismuth selenide (Bi2Se3), bismuth telluride (Bi2Te3), and boron nitride (BN), gallium aluminum arsenide (GaxAl1 xAs), gallium aluminum arsenide antimonide (GaxAl1 xAs1 y), gallium antimonide (GaSb), gallium arsenide phosphide (GaAsyP1 y), gallium arsenide, gallium indium antimonide (GaxIn1-xSb), gallium indium phosphide (GaxIn1 xP), gallium nitride (GaN), gallium phosphide (GaP), germanium (Ge), indium aluminum arsenide (InxAl1 xAs), indium antimonide (InSb), indium arsenide (InAs), indium arsenide phosphide (InAsyP1-y), indium gallium aluminum arsenide (InxGyAl1 x yAs), indium gallium arsenide (InxGa1-xAs), indium gallium arsenide antimonide (InxGa1 xAsySB1 y) indium gallium arsenide phosphide (InxGa1 xAsyP1 y), indium gallium nitride (InxGa1-xN), indium phosphide, lead telluride, lead tin telluride (Pbx Sn1 xTe), mercury cadmium selenide (HgxCd.1 xSe), mercury cadmium telluride (HgxCd1-xTe), silicon germanium, silicon, zinc selenide (ZnSe), zinc telluride (ZnTe), where the subscripts x, y, z, 1-x, and 1-y denote the relative amounts of the atomic species in each ternary or quartenary materials and range from zero to one, inclusive.

The barrier-presenting layer 1502 may be made from materials including but not limited to semiconductors known to have carrier effective masses greater than 2, including but not limited to: rutile TiO2, anatase TiO2, porous anatase TiO2, SrTiO3, BaTiO3, Sr_x-Ba_y-TiO_z, LiNiO, LaSrVO3, organic semiconductors PTCDA, (3,4,9,10-perylenetetracarboxylicacid-dianhydride). The following materials and semiconductors with at least favorable ZT figure of merits and generally preferred for thermoelectric applications may also be used when their charge carrier effective masses are greater than two times that of the material chosen for their junction, including but not limited to: aluminum antimonide, aluminum gallium arsenide, aluminum oxide, bismuth selenide, bismuth telluride, boron nitride, gallium aluminum arsenide antimonide, indium aluminum arsenide phosphide, indium gallium alluminum nitride, indium gallium arsenide antimonide, indium gallium arsenide phosphide, lead europium telluride, lead telluride, and air. lead tin telluride, mercury cadmium selenide, mercury cadmium telluride, silicon germanium, silicon oxide, zinc selenide, zinc telluride.

The conductor becomes more like an insulator against heat energy transport, on the timescale of ballistic transport, and a very good, one directional conductor for charge carrier energy transport in the present thermoelectric and thermionic energy converters. Within this nanoscopic dimension the conductor can sustain a useful temperature gradient across it. The thermal isolation of the nanoscopic sandwich 1500-1501-1502 increases the efficiency of the electric generator process.

The addition of a low charge carrier effective mass material, a conductor 1501, between a lower charge carrier effective mass material 1500 (with values as low as 0.02 $m\_e$), and a highest charge carrier effective mass material 1502 (with values as high as 200, $m\_e$, such as TiO$_2$), expands the range of materials that may be used in a solid state energy converter.

One embodiment includes catalyst clumps 505 physically isolated and electrically connected through electron tunneling. The clumps 505 replace at least some and in some configurations the entire conductor 506 on the surface of an electric potential barrier (dielectric) material 507.

Another embodiment uses such nanoscopic constraints on the dimension of conducting catalyst clusters, sheets, nanowires, nano-dots, nano-tubes, quantum dots, layers and constructs 505 to enhance reaction rates in chemically energized pre-equilibrium energy converters.

Tailoring Charge Carrier Thermal Coupling

According to one embodiment the energy transfer between materials in contact with the heat or hotter electron source and the colder region are controlled to be predominantly by ballistic charge carrier transport. Referring to FIGS. 16-A through 16-D, we show a cross section of a device using three materials or regions. As a general governing principle, the first and second regions, 1601 and 1602, are designed to block heat and transmit energized, ballistic carriers with minimal energy loss. The ideal condition is the transport of energy only by ballistic electrons (charge carriers) and not by heat, from region 1601, 1602 to region 1603. As a general governing principle, third region 1603 is designed to pass only the more energetic ballistic charge carriers against and over an electrical potential barrier, and to refract the direction of the ballistic carriers so they transport directly into the potential. The refraction is enhanced when the third region 1603 has a carrier effective mass at least two times higher that of the conductor region 1602, and is overwhelmingly so when it is higher by at least a factor of 2. The first and second regions 1601, 1602 are generally characterized by a favorable ZT thermoelectric figure of merit. The second region 1602 is generally characterized by an enhanced tendency to transmit a large number of ballistic electrons, and this is generally referred to as having a relatively long mean free path.

The first material 1601 may have a higher, equal or lower charge carrier effective mass than the second material 1602. In addition, the first material 1601 may or may not present an electrical potential barrier to carriers traveling, backwards from the second material 1602 back into the first material 1601. These two options result in four cases, each case having relative advantages. The choice depends on material availability, manufacturability, cost, stability and other factors.

One embodiment including the first case FIG. 16-A, with minimal or no barrier in the first material and an increasing charge carrier effective mass from left to right 1601, 1602, 1603, offers the fastest and shortest path transfer of energetic electron energy into the barrier material with highest charge carrier effective mass 1603. Nearly any of the common semiconductors may be used as the first material because virtually all of them are commercially valuable precisely in part because their charge carrier effective masses are all low, less than 1 m_e. This means that all the known favorable ZT materials can be used very effectively. A minimal barrier can be achieved by band gap engineering or degenerative doping.

One embodiment including the second case FIG. 16-B, with minimal or no barrier in the first material 1601 and since the middle material 1602 has the lowest charge carrier effective mass, it allows charge carriers in the middle material to exit the material more easily than allowing entry of charge carriers from materials 1601 and 1603. For example, electrons that have energies too low to surmount the barrier in material 1603 are not only reflected back into middle material 1602 but also are quickly transported to the warmer material 1601 for reheating and reprocessing. The middle, inner region 1602 is electronically, and therefore in the case of ballistic transport, thermally isolated to the outer regions 1601, 1603. This tends to minimize energy transfer from electrons to lattice, which in turn minimizes heat conductivity losses. The back-to-back ballistic refraction tends to isolate the two heat bath regions 1601 and 1603.

One embodiment including the third case FIG. 16-C, with a barrier in the first material 1601 and an increasing charge carrier effective mass, provides fastest transport of only the hottest charge carrier of the first material 1601.

One embodiment including the fourth case FIG. 16-D, presents electrical barriers against charge carrier transport back into the hotter material 1601 and into the colder material 1603, and has the minimum charge carrier effective mass in the middle material 1602. This configuration almost reversibly communicates carrier energy between two heat baths, which is a key property, and because of the ballistic transport, and preferentially transports charge carrier energy faster than by lattice phonon or other energy transfer. Note that ballistic transport is only necessary in the middle region 1602 and not in the surrounding regions 1601, 1603. The charge carrier may be negative or positive, and the barriers are designed to retard transport. Example materials for the regions can be, for example, TiO2 for the outer regions and Silicon for the middle region, where band gap alignments provide the barrier. The middle region 1602 materials can be chosen from the group including at least metals with long mean free paths, such as Cu, Au, Ag, Al, and materials with high ZT.

One embodiment uses the same barrier region material on both sides of the conductor.

One embodiment to use thermally energized ballistic refraction energy converters as refrigerators utilizes one or more stacked converters and applies a positive potential across the terminals instead of the negative potential obtained from the same device used as a generator. The heat sink may then be hotter than the heat source, and cooling occurs because the hot electrons are efficiently removed from the cooled regions. The use of ballistic refraction enhances the efficiency of such a cooling method and device over devices where carriers are not directed predominantly into the potentials at the interfaces of low and high charge carrier effective mass materials.

Embodiments form one or more refrigerating ballistic refraction energy converters directly on integrated circuits to cool them. A similar embodiment forms a refrigerating ballistic refraction energy converter directly on chemical reaction surfaces, for example, to control reaction pathways and control reactions.

Fuels, Oxidizers, Autocatalysts, Stimulators

Embodiments use storable reactants including oxidizers, autocatalytic reaction accelerators, decelerators, and monopropellants. The liquid phase, such as liquid hydrogen peroxide $H_2O_2$ at standard pressure and temperature, are convenient because their heat of vaporization is used as coolant and the liquid is conveniently storable. Monopropellants such as $H_2O_2$ and monomethylhydrazine (MMH) are similarly convenient and energize the active surface of converters. Autocatalytic accelerators include monopropellants such as $H_2O_2$.

One embodiment uses thermally isolated catalysts in close proximity to the active surface of ballistic refraction converter assemblies to enhance reaction rates and concentrate thermally hot entities to the thermally hot region of the converter.

Figure 17:
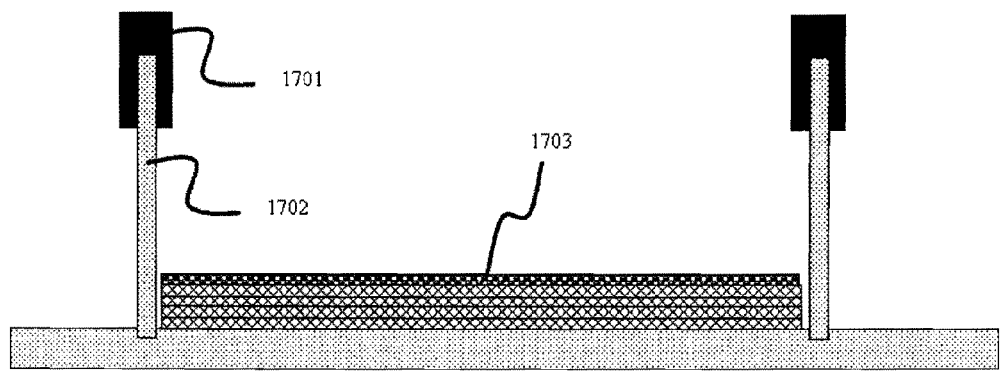
FIG. 17 illustrates an exemplary cross section of catalytic accelerators on pillars, thermally isolated nanoscopically and near active surface of ballistic refraction converter assemblies on a support structure.

FIG. 17 shows an embodiment where a highly reactive catalyst 1701 is placed on a thermally isolated pillar structure 1702 in close proximity to the active surface 1703 of a converter. Gas phase reaction products created in the vicinity of the catalyst energize the converter. The products may include one or more of at least highly vibrationally excited molecules, reactive molecules, and hot gases.

Embodiments use energetic reactants chosen to maximize the energizing of highly energetic specie, which include one or more of highly vibrationally excited molecules (HVEM), hot atoms, charged adsorbate intermediates such as peroxo and superoxo specie formed during precursor mediated dissociative adsorbsion, adsorbates participating in association reactions both of the Langmuir-Hinshelwood and of the Eley-Rideal type, and reaction intermediates such as radicals, free radicals and specie considered to be catalytic or autocatalytic.

Embodiments provide means for the energizing to occur directly on or in the vicinity of a conductor. The term "vicinity" refers here to a distance less than a few mean free paths of the particular energetic excitation. Embodiments use these excitations to energize a low charge carrier effective mass material of the ballistic refraction energy converter.

Chemical reactions using reactants of this kind result in pre-equilibrium excitation including reaction effective temperatures and effective carrier temperatures in excess of 10,000 Kelvin on and in metals, conductors, catalysts, semiconductors and ceramics, and where the carriers include excitons, carriers in the conduction and/or valence band of semiconductors and insulators.

One embodiment uses reactions and reactants to energize these excitations. The reactions, reactants and additives include at least monopropellants, high energy fuels with oxidizers, hypergolic mixtures, and additives and combinations of reactants known to produce autocatalytic specie, reactants chosen to accelerate reactions or to control reactions, and combinations thereof. The reactants and/or additives include but are not limited to the following reactants:

TABLE I

| energetic fuels more storable than ammonia |
| --- |
| amine substituted ammonias |
| Di-Methyl-Amine $(CH_3)_2NH$ |
| Tri-Methyl-Amine $(CH_3)_3N$ |
| Mono-Ethyl-Amine (C2H5)NH2 |
| Di-Ethyl-Amine $(C_2H_5)_2NH)$ |
| other classes more easily storable |

| |
| --- |
| Methanol, $CH_3OH$ |
| Ethanol, EtOH CH3CH2OH |
| Formic Acid, HCOOH |
| diesel fuels |
| gasoline |
| alchohols |
| slurries including solid fuels |
| Carbon Suboxide, $C_3O_2$, CO=C=CO, |
| Formaldehyde HCHO, |
| Paraformaldehyde, = better $HCHO)_n$, sublimeable to Formaldehyde gas. (Potentially a cell coolant at the same time). |
| less storable fuels |

| |
| --- |
| Carbon Monoxide |
| Hydrogen |
| Ammonia NH3 |
| energetic fuels containing Nitrogen |

| |
| --- |
| Nitromethane, $CH_3NO_2$ |
| Nitromethane "cut" with Methanol = model airplane "glow plug" engine fuel |
| High energy fuels with wide fuel/air ratio |

| |
| --- |
| Epoxy-Ethane, = Oxirane or Ethylene-Oxide CH2—CH2 O |
| 1,3-Epoxy-Propane = Oxetane and Tri-Methylene-Oxide = 1,3-Methylene-Oxide $CH_2$—$(CH_2)$—$CH_2$ O |
| Epoxy-Propane CH2—(CH2)—CH2 O |
| Acetylene, $C_2H_2$ |
| Diacetylene = 1,3-Butadiyne |
| 1,3-Butadiene $CH_2$=CH—CH=$CH_2$, |
| less exotic high energy fuels |

| |
| --- |
| Di-Ethyl-Ether or surgical ether |
| Acetone = Di-Methyl-Ketone |
| less exotic, volatile fuels |

| |
| --- |
| Cyclo-Propane |
| Cyclo-Butane |
| Hydrocarbons such as methane, propane, butane, pentane, etc. |
| other storable fuels |

| |
| --- |
| Methyl Formate HCOO—$C_2H_5$ |
| Formamide HCO—$NH_2$ |

TABLE I-continued

| |
| --- |
| N,N,-Di-Methyl-Formamide HCO—N—$(CH_3)_2$ |
| Ethylene-Diamine $H_2N$—$CH_2$—$CH_2$—$NH_2$ |
| Ethylene-Glycol |
| 1,4-Dioxane = bimolecular cyclic ether of Ethylene-Glycol |
| Paraldehyde $(CH_3CHO)_3$ cyclic trimer of Acetaldehyde |
| powerful oxidizer |

| |
| --- |
| Tetra-Nitro-Methane, $C(NO_2)_4$ . . . does not spontaneously decompose . . . just pass the two separate vapors over the reaction surface of the cell in the gas phase |
| Hydrogen Peroxide H2O2 |
| low initiation energy mixtures |

| |
| --- |
| Cyclo-Propane with Oxygen = surgical anesthetic, microjoules initiator |
| Hypergolics |

| |
| --- |
| UDMH = Unsymmetrical DiMethyl Hydrazine = 1,1-DiMethyl Hydrazine $(CH_3)_2NNH_2$ |
| UDMH is hypergolic usually with $N_2O_4$ $_{and}$ is a very potent carcinogen |
| MMH MonoMethyl Hydrazine $(CH_3)HNNH_2$ hypergolic with any oxidizers, e.g. $N_2O_4$ |
| Corrosive Toxic energetic monopropellant |

| |
| --- |
| Hydrazine = $H_2NNH_2$ decomposed easily with a catalyst (usually Pt or Pd or Molybdenum Oxide |
| Hydrazine Hydrate |

A method and system for ballistic charge carrier refraction have been disclosed. Although the present methods and systems have been described with respect to specific examples and subsystems, it will be apparent to those of ordinary skill in the art that it is not limited to these specific examples or subsystems but extends to other embodiments as well.

We claim:

1. An apparatus, comprising:
one or more solid-state electric generators, the solid-state electric generators including at least one chemically energized solid-state electric generator; wherein the one or more solid-state electric generators include:
a solid-state junction comprised of a first material and a second material, wherein the first material comprises a nanoscopic cluster and is over the second material but maintains sufficient contact with the second material, the second material being porous, to form a solid-state electric generator; and
a heat sink that removes heat from the one or more solid state electric generators, the heat sink having a heat sink temperature higher than an ambient temperature;
wherein the one or more solid-state electric generators use an interaction of chemically energized reactants to energize a charge carrier between the first and second material.

2. The apparatus of claim 1, wherein the second material contains microscale or nanoscale protrusions at the surface.

3. The apparatus of claim 1, wherein the at least one chemically energized solid-state electric generators include an electrical potential barrier that retards transport of the charge carrier between the first material and the second material.

4. The apparatus of claim 1, wherein the second material is chosen from a materials group including crystalline, polycrystalline, or porous $TiO_2$, $SrTiO_3$, $BaTiO_3$, Sr_x-Ba_y-Ti_z, boron carbide, LiNiO, and $LaSrVO_3$ PTCDA, or 3,4,9,10-perylenetetracarboxylicacid-dianhydride.

5. The apparatus of claim 1, wherein the heat sink is directly connected to the second material.

6. The apparatus of claim 1, wherein the one or more solid-state electric generators comprise a plurality of solid-state electric generators that are connected electrically in series, electrically in parallel, or combinations of series and parallel.

7. The apparatus of claim 1, wherein the one or more solid-state electric generators comprise a plurality of solid-state electric generators that are connected thermally in series, thermally in parallel, or combinations of series and parallel.

8. The apparatus of claim 1, comprising buss bars on the active surface of one or more solid-state electric generators.

9. The apparatus of claim 1, wherein the nanoscopic cluster has discontinuous porous coverage over the second material.

10. The apparatus of claim 1, wherein the first material comprises a plurality of nanoscopic clusters.

11. The apparatus of claim 1, wherein the nanoscopic cluster comprises a catalyst.

12. A chemically energized solid-state electric generator comprising:
a solid state junction comprising a first material and a second material, wherein the first material comprises a nanoscopic cluster and is over the second material but maintains sufficient contact with the second material, the second material being porous, to form a solid-state electric generator; and
a heat sink that removes heat from the one or more solid state electric generators, the heat sink having a heat sink temperature higher than an ambient temperature;
wherein an interaction of chemically energized reactants energizes a charge carrier between the first material and second material.

13. The chemically energized solid-state electric generator of claim 12, wherein the solid-state junction comprises a conductor-dielectric junction.

14. The chemically energized solid-state electric generator of claim 12, wherein the solid-state junction comprises a dielectric-dielectric junction.

15. The chemically energized solid-state electric generator of claim 12, wherein the solid-state junction comprises a dielectric-conductor-dielectric junction.

16. The chemically energized solid-state electric generator of claim 12, wherein the solid-state junction comprises a Schottky barrier.

17. The chemically energized solid-state electric generator of claim 12, wherein the solid-state junction comprises a p-n junction potential barrier.

18. The chemically energized solid-state electric generator of claim 12, wherein the nanoscopic cluster has discontinuous porous coverage over the second material.

19. The chemically energized solid-state electric generator of claim 12, wherein the first material comprises a plurality of nanoscopic clusters.

20. The chemically energized solid-state electric generator of claim 12, wherein the nanoscopic cluster comprises a catalyst.

21. The apparatus of claim 1, wherein the first material has a width that is less than the mean free path for hot carriers in the first material.

22. The apparatus of claim 1, wherein the first material has a width that allows the carrier transit time to be shorter than the period of the highest lattice vibration of the first material.

23. The apparatus of claim 12, wherein the first material has a width that is less than the mean free path for hot carriers in the first material.

24. The apparatus of claim 12, wherein the first material has a width that allows the carrier transit time to be shorter than the period of the highest lattice vibration of the first material.

* * * * *